US010666085B2

(12) United States Patent
Li

(10) Patent No.: US 10,666,085 B2
(45) Date of Patent: May 26, 2020

(54) SYSTEM AND METHOD FOR DISCHARGING AN EXCITATION COIL

(71) Applicant: Infineon Technologies AG, Neubiberg (DE)

(72) Inventor: Chao Li, Beijing (CN)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/259,727

(22) Filed: Jan. 28, 2019

(65) Prior Publication Data
US 2019/0237990 A1 Aug. 1, 2019

(30) Foreign Application Priority Data

Jan. 31, 2018 (DE) .................. 10 2018 102 145

(51) Int. Cl.
| *H02J 7/14* | (2006.01) |
| *H02P 9/10* | (2006.01) |
| *H02P 21/00* | (2016.01) |
| *H02P 9/12* | (2006.01) |
| *H02P 101/45* | (2016.01) |
| *G01R 19/165* | (2006.01) |

(52) U.S. Cl.
CPC ...... *H02J 7/1492* (2013.01); *G01R 19/16542* (2013.01); *H02J 7/1446* (2013.01); *H02P 9/107* (2013.01); *H02P 21/0089* (2013.01); *H02P 9/12* (2013.01); *H02P 2101/45* (2015.01)

(58) Field of Classification Search
USPC .................... 322/28; 361/143, 149
See application file for complete search history.

(56) References Cited

U.S. PATENT DOCUMENTS

| 3,588,624 A | * | 6/1971 | Marvin | ................. | H01F 13/006 |
| | | | | | 361/149 |
| 3,784,868 A | * | 1/1974 | Shinkai | .................... | H04N 9/29 |
| | | | | | 315/8 |
| 3,859,573 A | * | 1/1975 | Siems | ..................... | H01F 13/00 |
| | | | | | 361/149 |
| 3,895,270 A | * | 7/1975 | Maddox | ................ | H01F 13/006 |
| | | | | | 361/149 |
| 4,456,875 A | * | 6/1984 | Chenier | ................. | G01R 31/00 |
| | | | | | 324/223 |

(Continued)

FOREIGN PATENT DOCUMENTS

| DE | 102005036257 A1 | 4/2006 |
| DE | 102009034423 A1 | 2/2010 |

OTHER PUBLICATIONS

Wai, Jackson et al., "A new control technique for achieving wide constant power speed operation with an interior PM alternator machine", IEEE Industry Applications Conference, Thirty-Sixth IAS Annual Meeting, Conference Record vol. 2, IEEE, 2001, pp. 807-814.

*Primary Examiner* — Pedro J Cuevas
(74) *Attorney, Agent, or Firm* — Slater Matsil, LLP

(57) ABSTRACT

A circuit for polarizing magnetic material using a magnetic field of an excitation coil includes a port configured to provide a connection with a DC power supply. The circuit also includes at least one capacitor and driver circuitry configured to drive the excitation coil and the at least one capacitor. The driver circuitry is configured to discharge the excitation coil to the DC power supply via the at least one capacitor.

16 Claims, 18 Drawing Sheets

(56) References Cited

U.S. PATENT DOCUMENTS

| | | | | |
|---|---|---|---|---|
| 4,462,060 A * | 7/1984 | Schmoock | G01F 1/60 | 361/154 |
| 4,471,403 A * | 9/1984 | Dress, Jr. | H01F 13/006 | 361/143 |
| 4,956,728 A * | 9/1990 | Hayata | G11B 5/024 | 360/66 |
| 4,970,621 A * | 11/1990 | Gailbreath | G11B 5/465 | 360/46 |
| 5,053,893 A * | 10/1991 | Hayata | G11B 5/024 | 360/66 |
| 5,721,665 A * | 2/1998 | Schultz | G11B 5/0245 | 361/149 |
| 6,160,697 A * | 12/2000 | Edel | G01R 15/185 | 361/143 |
| 6,295,834 B1 * | 10/2001 | Driehuys | G01R 33/28 | 62/55.5 |
| 6,430,960 B1 * | 8/2002 | Driehuys | G01R 33/28 | 165/61 |
| 6,484,532 B2 * | 11/2002 | Driehuys | G01R 33/28 | 62/55.5 |
| 6,522,517 B1 * | 2/2003 | Edel | G01R 15/185 | 361/143 |
| 6,577,111 B1 * | 6/2003 | Dickmander | H02M 3/33507 | 323/356 |
| 6,954,060 B1 * | 10/2005 | Edel | G01R 15/183 | 324/117 R |
| 7,242,157 B1 * | 7/2007 | Edel | G01R 15/185 | 315/362 |
| 8,004,813 B2 * | 8/2011 | May | H01F 13/00 | 361/143 |
| 8,934,210 B1 * | 1/2015 | Denis | H01F 13/006 | 361/149 |
| 9,418,782 B1 * | 8/2016 | Feller | G01F 1/582 | |
| 9,614,473 B1 | 4/2017 | Qian | | |
| 10,458,949 B2 * | 10/2019 | Hobelsberger | G01N 27/82 | |
| 2002/0029586 A1 * | 3/2002 | Driehuys | G01R 33/28 | 62/637 |
| 2002/0066287 A1 * | 6/2002 | Driehuys | G01R 33/28 | 62/637 |
| 2005/0151515 A1 | 7/2005 | Isurin et al. | | |
| 2010/0079117 A1 | 4/2010 | Bekiarov | | |
| 2016/0370324 A1 * | 12/2016 | Hobelsberger | G01R 31/34 | |

\* cited by examiner

FIG. 18
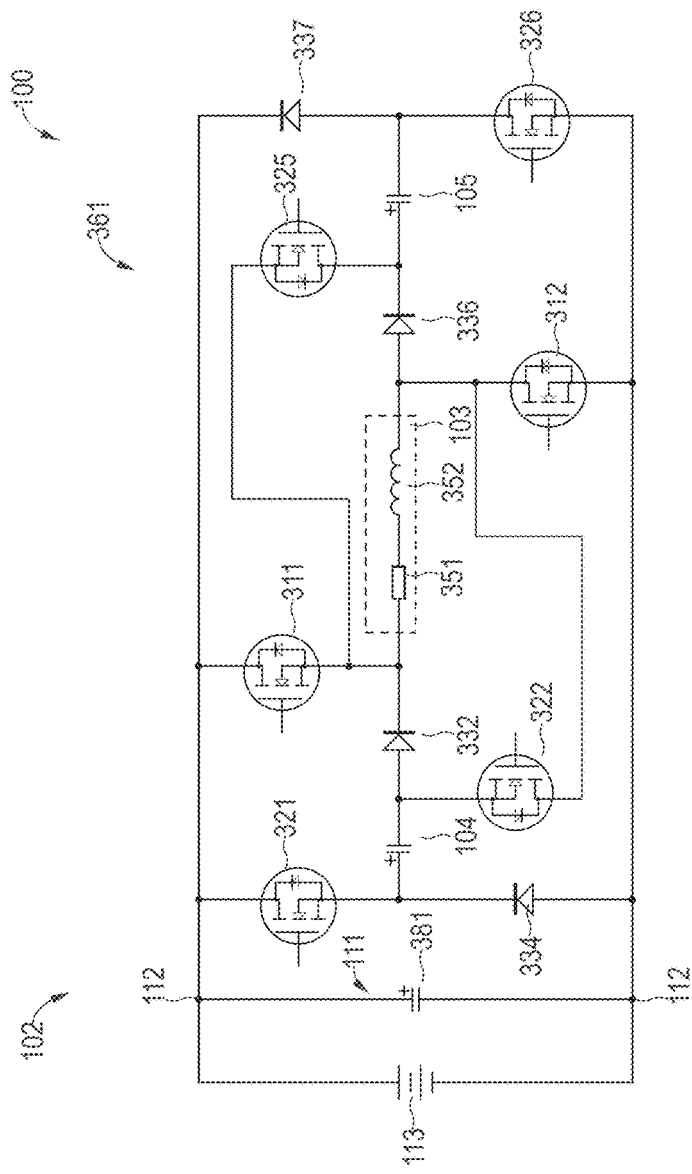
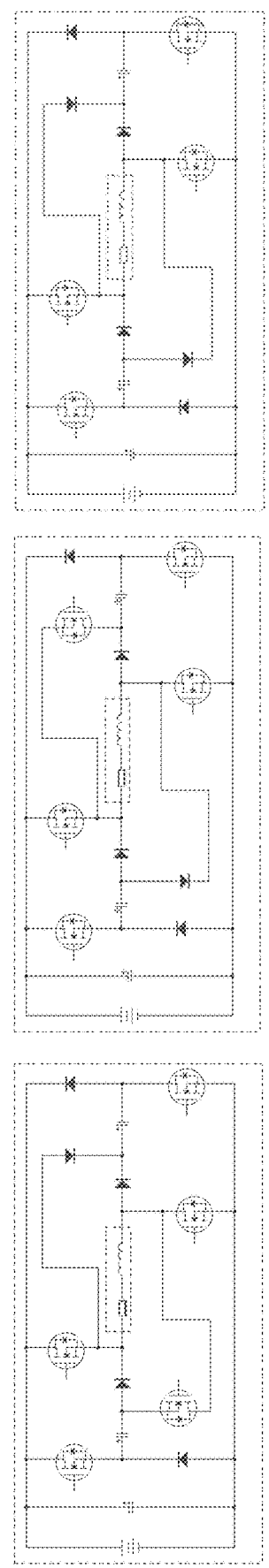

SYSTEM AND METHOD FOR DISCHARGING AN EXCITATION COIL

This application claims the benefit of German Application No. 102018102145.3, filed on Jan. 31, 2018, which application is hereby incorporated herein by reference in its entirety.

TECHNICAL FIELD

Various examples of the invention generally relate to techniques of operating a driver circuitry of an excitation coil of a circuit for polarizing magnetic material. Various examples specifically relate to discharging the excitation coil via at least one capacitor.

BACKGROUND

Electric motors are used in various use cases. One scenario in which an electric motor finds application are belt-driven starters and generators (BSG). Here, an electric motor is coupled with an internal combustion engine of a vehicle, e.g., via a crankshaft of the combustion engine.

A direct current (DC) power supply is used to operate the electric motor. Recently, use of DC power supplies having a DC supply voltage of 48 V has become popular.

Various implementations of electric motors are known. For example, implementation of electric motors in a claw-pole design is known. Generally, electric motors include a stator and a rotor, wherein the rotor can move with respect to the stator. An excitation coil is used to polarize magnetic material, to thereby increase the magnetic flux between rotor and stator. Thereby, a torque acting between the stator and the rotor can be increased.

Polarization of magnetic material corresponds to aligning the magnetization of the magnetic material along a common direction; such a state is sometimes referred to as saturation.

A current flow through the excitation coil is used to charge the excitation coil and to polarize the magnetic material towards saturation. The direction of the magnetic field in the excitation coil is the same as the direction of the magnetic field in the magnetic material. Typically, soft ferromagnetic material is used. Thereby, the polarization of the magnetic material can be varied significantly between saturation (full magnetic field applied) and remanence (no magnetic field applied), by charging and discharging the excitation coil.

The current flow in the excitation coil is a DC current. Generally, the current flow is not larger than 10 A. The excitation coil can be modelled by an inductor having a significant inductance, and a resistor connected in series with the inductor. Typical values of the inductance are a few mH to a few hundred mH.

A BSG can operate in different system states. A first system state is sometimes referred to as motoring state; and the second system state is sometimes referred to as generating state. For example, in motoring state, the electric motor drives a load, typically, the combustion engine; differently, in generating state, the electric motor is driven by the load, e.g., due to mass inertia thereof. As a general rule, the BSG will consume power provided by the DC power supply in motoring state; but will provide power to the DC power supply in generating state. For example, in motoring state, the BSG can provide a torque for start-up of the combustion engine or additional acceleration. Differently, the generating state may be activated when the combustion engine is not required to provide torque, as may be the case, e.g., during braking or freewheeling of the vehicle. In generating state, the BSG can act as an alternator to provide electrical energy to the DC power supply. For example, the electrical energy may be used for charging a battery connected to the DC power supply.

However, there is a risk that providing electrical energy to the DC power supply results in a failure state or even damage to the system. For example, scenarios can be encountered in which the battery is disconnected from the DC power supply. Then, the electrical energy provided by the BSG cannot be used for charging of the battery. Then, a voltage on the DC power supply may exceed a threshold voltage associated with safe operation. For example, a typical threshold voltage of a DC power supply operating nominally at 48 V may be 60 V. This threshold voltage can be reached quickly, e.g., if the torque provided to the BSG is high, e.g., as may be the case for high-speed operation that can be encountered at large velocities of the vehicle. If the threshold voltage is reached, breakdown of electric components including damage to the electric components can occur.

There are various techniques known in the art to mitigate such excessive feedback of energy into the DC power supply.

One technique involves reducing the current flow in the excitation coil, preferably to zero. Then, the magnetic material is de-polarized and the induced voltage at phase windings is reduced, due to weaker flux coupling. Typically, a design strategy of electric motors includes setting the voltage induced at the phase windings due to the phase windings moving relative to the magnetic field, the so-called "back electromotive voltage", BEMV, sometimes also referred to as "back electromotive force" (BEMF) such that, at zero current flow through the excitation coil, a threshold voltage of the respective DC power supply is not exceeded. The BEMV is a voltage across any two motor phase winding terminals, which is generated in electric motors, when there is a relative motion between the armature and the magnetic field produced by the field coils of the motor. Since the BEMV has a tendency to increase with increasing motor speed (e.g., measured in rounds per minute, rpm), the design—e.g., of the size of the gap between rotor and stator, the shape and magnetization of the magnetic material used, etc.—is typically set such that this design constraint is fulfilled at all relevant motor speeds. For example, a 48 V BSG can be designed for a maximum motor speed of 16,000 rpm: here, the BEMV at maximum current flow—e.g., 4 A—in the excitation coil can amount to 250 V; differently, the BEMV at zero current flow through the excitation coil can amount to only approximately 50 V, which is well below the typical threshold voltage of 60 V. From this example, it is clear that even for small residual current flows in the excitation coil there is a significant risk of damage of electrical components due to overvoltage at the DC power supply. Typical time durations from maximum current flow to zero current flow in the excitation coil (discharge time) can be as long as 15 ms for worst-case scenarios. A discharge time in this order of magnitude is typically long enough to result in damage of electrical components due to excessive overvoltage fed back to the DC power supply.

To reduce the discharge time, flux weakening techniques (sometimes also referred to as field-oriented control (FOC)) can be employed. For example, a FOC technique is described in U.S. Pat. No. 9,614,473 B1 or Wai, Jackson, and Thomas M. Jahns, "A new control technique for achieving wide constant power speed operation with an interior PM alternator machine", Industry Applications Conference, 2001, Thirty-Sixth IAS Annual Meeting, Conference Record of the 2001 IEEE, Vol. 2, IEEE, 2001. In FOC, a current vector angle is controlled. An inverter is employed. Typically, the effectivity of the FOC is limited by the output current ability of the inverter. For example, a maximum output current of a 6 phase inverter can be limited to 150 A rms for each phase. Typically, due to the limited output current ability of the inverter, FOC may be helpful to reduce the gap magnetic field generated by the excitation coil current to some degree, but it is typically not possible to fully reduce the combined gap magnetic field to zero using FOC. Then, the residual current flow in the excitation coil can be sufficient to cause excessive overvoltage is on the DC power supply.

Further, to reduce the discharge time, an active short technique may be employed. For such techniques, 3 high-side/low-side switches are turned on synchronously, to force stator windings short for a certain time duration. During this time duration, the inverter cannot generate any voltage, irrespective of the motor speed. After the time duration, the switches are turned off again this. After the time duration, the current flow in the excitation coil has reduced to zero; and hence, the BEMV is comparably small. However, the active short technique has the disadvantage that comparably large torque can be observed. Typically, the torque created by the motor will follow and meet the commanded torque from a central control unit. Then, when shorting, the torque may further increase. Further, the current flow through the switches can be high when shorting. Damage may result. A further disadvantage includes increased complexity for the inverter when entering a safe state; this is because the driver circuitry for the 3 high side/low-side switches must be kept active, even when entering a safe state in which further components are disabled.

SUMMARY

A circuit for polarizing magnetic material using a magnetic field of an excitation coil includes a port. The port is configured to provide a connection with a DC power supply. The circuit also includes at least one capacitor. The circuit further includes a driver circuitry configured to drive the excitation coil and the at least one capacitor. The driver circuitry is configured to discharge the excitation coil to the DC power supply via the at least one capacitor.

A system includes the circuit for polarizing magnetic material using the magnetic field of the excitation coil, the excitation coil, and a device including the magnetic material.

A method of polarizing a magnetic material includes discharging an excitation coil via at least one capacitor.

A method of polarizing a magnetic material includes implementing an ascending slope of the current flow in an excitation coil to polarize the magnetic material. The method also includes implementing a descending slope of the current flow in the excitation coil to de-polarize the magnetic material. The current flow in the descending slope is through the excitation coil and at least one capacitor.

These methods may be executed by the circuit for polarizing the magnetic material.

BRIEF DESCRIPTION OF THE DRAWINGS

FIG. 18 schematically illustrates the circuit for polarizing magnetic material according to various examples.

DETAILED DESCRIPTION OF ILLUSTRATIVE EMBODIMENTS

Figure 1:
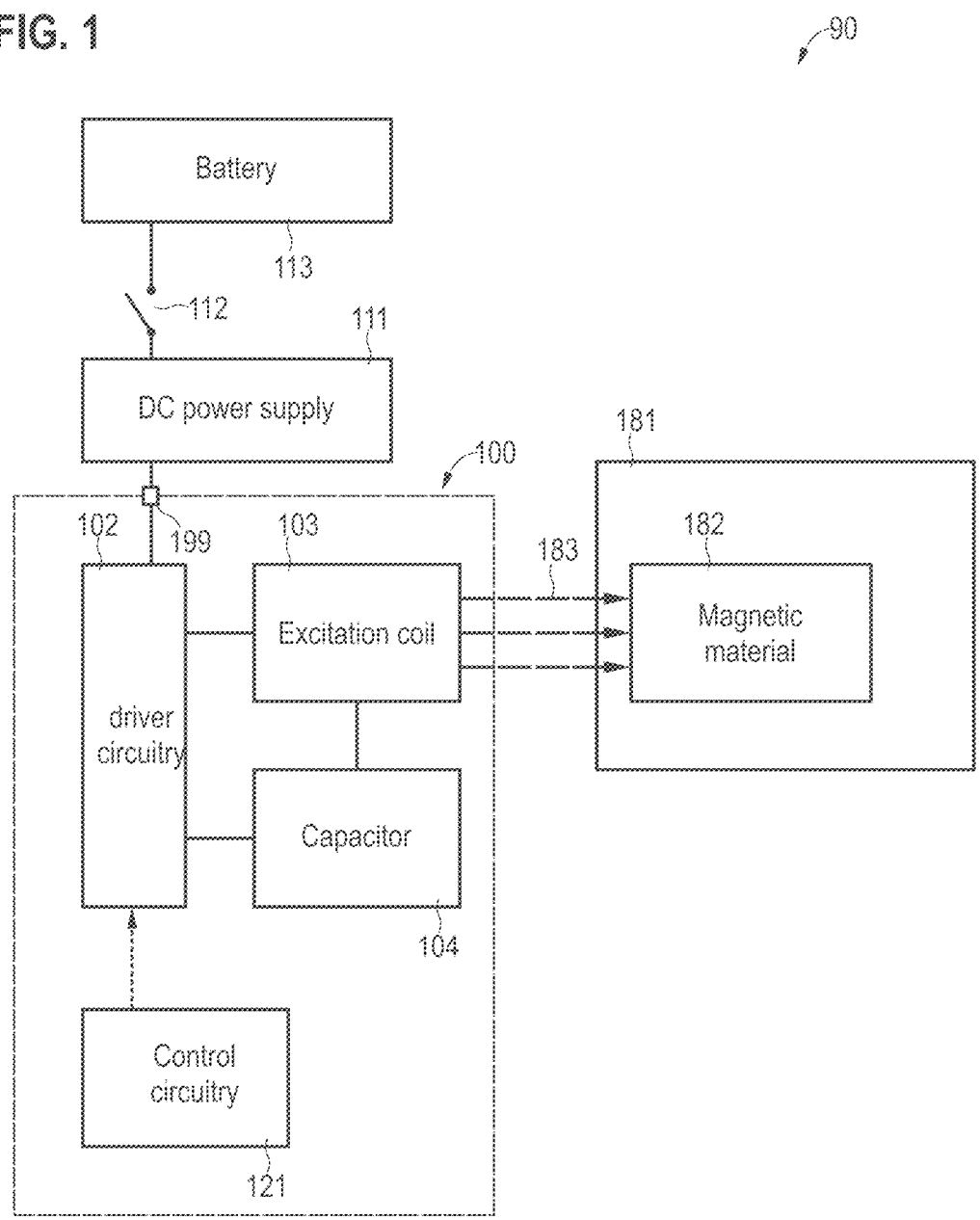
FIG. 1 schematically illustrates a system including a circuit for polarizing magnetic material according to various examples.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques of operating an excitation coil are described. The inductance of the excitation coil can be dimensioned to enable polarization of magnetic material, e.g., of ferromagnetic material. As a general rule, the inductance of the excitation coil may be not smaller than 50 mH, optionally not smaller than 200 mH, further optionally than 50 mH. The excitation coil may be wound around magnetic material or may be arranged in the vicinity of the magnetic material.

Thereby, the excitation coil may find application in various use cases where magnetic actuators are employed. Example use cases include, but are not limited to: magnetically-actuated valves; electric motors; electric relay; etc. Hereinafter, for sake of simplicity, various techniques will be described with respect to a use case including an electric motor; however, this is for illustrative purposes only and concepts described hereinafter may be readily applied to other use cases.

Hereinafter, techniques are described which facilitate quick release of energy from the excitation coil. In other terms, hereinafter, techniques are described which facilitate discharging of the excitation coil at a short discharge time. In still other terms, hereinafter, techniques are described which facilitate fast reduction of a current flow in the excitation coil; specifically, the techniques described herein may be used to facilitate reduction of the current flow in the excitation coil to small absolute values, e.g., to zero. A descending slope of the current flow can be provided which is associated with a large discharge rate, i.e., change of the current flow per time interval.

Such techniques may be helpful in scenarios in which fast reduction of the magnetic flux induced by the magnetic material polarized by the excitation coil is required. Such fast reduction of the magnetic flux may, e.g., be helpful where the excitation coil is employed to polarize magnetic material of an electric motor. Here, by quickly discharging the excitation coil, the magnetic material may be de-polarized, e.g., to remanence. Then, the stray magnetic field of the magnetic material is comparably small, specifically for soft magnetic material such as NiFe-alloys, etc. Then, the flux coupling between rotor and stator of the electric motor is reduced and, thereby, the BEMV of the phase windings is quickly lowered. This avoids persistent excessive overvoltage at a DC power supply coupled with the driver circuitry of the excitation coil.

As a general rule, the techniques described herein may find application in various system states. For example, the techniques described herein may find application in a motoring state of the system, where the electric motor is used to drive a load such as a combustion engine in case of a BSG. Alternatively or additionally, the techniques described herein may find application in a generating state of the electric motor, where the electric motor is driven by the load, e.g., by a inertia of the combustion engine in case of the BSG. Typically, the motoring state or the generating state involve pulse-width modulation (PWM) of the current flow in the excitation coil to implement an adjustable stable excitation current by periodical switching-on and switching-off of switches.

As a general rule, when employing PWM, the excitation coil may be periodically charged and discharged according to a charging mode of operation and a discharging mode of operation. Such periodically charging and discharging during PWM operation may be referred to as microscopic charging and microscopic discharging. The time-averaged excitation current may increase or decrease, i.e., may have an ascending slope or descending slope. Sometimes, the ascending slope is referred to macroscopic charging, and the descending slope is referred to macroscopic discharging. In other words, the macroscopic charging or macroscopic discharging may comprise microscopic charging and microscopic discharging according to PWM.

To avoid excessive overvoltage to be fed back to the battery and the DC power supply, fast discharging is needed. For example all switches turn off and remain turned off until the excitation current reduces to zero. This again corresponds to a respective discharging mode of operation.

According to various examples, fast discharging of the excitation coil is achieved by connecting the excitation coil in series with a capacitor. Then, the capacitor may facilitate a high discharge rate. Hence, the excitation coil may be discharged via the capacitor.

By such a series connection of the excitation coil and the capacitor, a commutation circuitry may be implemented. When discharging, the voltage across the coil is increased by the voltage across the capacitor. This results in an increased discharge rate.

According to examples, the capacitor may be selectively connected in series with the excitation coil in a mode of operation of an associated driver circuitry which includes discharging of the excitation coil. This mode of operation may be referred to as discharging mode. According to examples, the capacitor may not be connected in series with the excitation coil in a further mode of operation of the driver circuitry which includes charging of the excitation coil. This mode of operation may be referred to as charging mode. One or more switches of the driver circuitry may be operated accordingly to provide the selective series connection of the excitation coil and the capacitor. Such selective series connection has the advantage that the charging process of the excitation coil is not altered by the capacitor. Rather, it may be possible to charge the capacitor and the excitation coil in parallel. A decoupling of the excitation coil and the capacitor can be provided in the charging mode.

The discharging mode may result in a descending slope of the current flow in the excitation coil.

By using the selective series connection, it is possible to implement the discharge rate to be larger than the charge rate. Hence, the discharging may be implemented comparably fast.

As a general rule, it is possible to employ a single capacitor or more than one capacitor. Hereinafter, various example scenarios are discussed which may be readily adapted to use a larger count or smaller count of capacitors. Typically, there is a tendency that a less count of capacitors reduces the decent time.

The employed capacitors may have a capacity in the range of 10 µF to 1 mF. Typically, since the voltage across the capacitor increases for decreasing capacity, the discharge rate may be increased for smaller capacities.

In the various examples described herein, there are different options available for implementing the driver circuitry. One scenario includes using an H-bridge. An H-bridge is configured to apply a voltage across an associated load. The load can be implemented by the excitation coil. The H-bridge is configured to steer a current flow across an associated load. An H-bridge typically includes two switches and two diodes. In some scenarios, the H-bridge may include four switches.

Typically, in the scenarios described herein, the H-bridge is not used to switch the directivity of a current flow in the excitation coil. Typically, the directivity of the current flow in the excitation coil is fixed by the design of a corresponding system. Generally, the directivity of the current flow in the excitation coil is unidirectional. The current flow may drop below zero. This means that there is a current input terminal and the current output terminal associated with the excitation coil. The current input terminal can be connected to a switch of an H-bridge; and the output terminal of the excitation coil can be connected to a further switch of the H-bridge.

According to some examples, the H-bridge can be modified. The H-bridge can be modified to include the at least one capacitor. Additionally, it would be possible to modify the H-bridge to include one or more further switches to provide for the selective decoupling of the at least one capacitor and the excitation coil.

FIG. 1 schematically illustrates aspects with respect to a system 90. The system 90 includes a circuit 100, a DC power supply 111, and a device 181. A battery 113 is connected to the circuit 100 via the DC power supply 111.

Optionally, a switch 112 is provided that can be used to disconnect the battery 113 from the DC power supply in. The switch 112 may support protection functionality for the battery 113. Specifically, overvoltage imposed on the battery cells of the battery 130 may be prevented, e.g., if a significant BEMV is observed at phase windings.

The DC power supply 111 is coupled with the circuit 100 via a port 199. For example, the port 199 may be implemented via a bond pad, bonding wire, socket or plug.

The DC power supply 111 may be implemented by a DC bus system. The DC power supply 111 may include electrical wiring and DC link capacitor for supporting DC current flows and DC voltages. An example nominal operational voltage of the DC power supply 111 is in the range of 24 V-54V, e.g., 48 V. Overvoltages may correspond to an excess voltage if compared to the nominal operational voltage.

The circuit 100 includes the excitation coil 103 and a capacitor 104. The capacitor 104 facilitates quick discharging of the excitation coil 103.

The circuit 100 also includes a driver circuitry 102. The driver circuitry 102 is configured to control operation of the excitation coil 103 and the capacitor 104. For example, the driver circuitry 102 may include one or more switches. As a general rule, a switch provides for current control depending on an associated voltage. For example, at least some of the one or more switches of the driver circuitry 102 may be implemented as solid-state switches, e.g., field effect transistors (FETs), etc. For example, at least some of the one or more switches of the driver circuitry 102 may be implemented as diodes.

As a general rule, different designs are conceivable for the driver circuitry 102. One example design includes an H-bridge for controlling the current flow between the DC power supply in and the excitation coil 103 and the capacitor 104. The driver circuitry may include a plurality of switches.

The excitation coil 103 is configured to generate a magnetic field 183. For example, a DC current flow in the excitation coil 103 can be proportional to the field strength of the magnetic field 183. The magnetic field 183 can be used to polarize magnetic material 182 of the device 181. In this regard, the excitation coil 103 can be arranged in the proximity of the magnetic material 182. In some examples, the excitation coil 103 can be wound about the magnetic material 182, because, typically, the field strength of the magnetic field 183 in the area of the magnetic material 182 can then be maximized.

The circuit 100 also includes control circuitry 121. The control circuitry 121 is configured to control operation of the driver circuitry 102. The control circuitry 121 may be implemented in hardware and/or software. For example, the control circuitry 121 may include a microprocessor, a Field Programmable Array (FPGA), an Application Specific Integrated Circuit (ASIC), etc. Operation control may include operating the one or more switches of the driver circuitry 102 in a conductive state or a non-conductive state, sometimes also referred to as ON-state and OFF-state. For example, in case the one or more switches are implemented by one or more solid-states switches, then the conductive state may be associated with a low resistivity between an input terminal and an output terminal of the respective switch, while the non-conductive state may be associated with a high-resistivity between the input terminal and the output terminal. For this, the control circuitry 121 may include one or more control-terminal driver circuitries connected with control terminals of the one or more switches (referred to as gate terminals for FETs).

Generally, the control circuitry 121 may be configured to selectively activate the charging mode of the excitation coil or the discharging mode of the excitation coil. The charging mode of the excitation coil and the discharging mode of the excitation coil may be activated by appropriately operating the one or more switches of the driver circuitry 102.

As a general rule, the control circuitry 121 may be configured to take into account one or more trigger criteria for activating either the charging mode or the discharging mode. Example trigger criteria include a timing of PWM. This may be helpful if the system 90 is in motoring state and generating state. Thereby, a motor torque may be set. The charging mode and the discharging mode may be alternatingly activated in accordance with the timing.

Example trigger criteria also include a signal indicative of a voltage across the phase windings. Example trigger criteria further include a signal indicative of a voltage at the DC power supply iii. This may be helpful if the system 90 is in generating state. For example, excessive overvoltage fed back to the DC power supply in due to a large BEMV observed at phase windings in generating state can thereby be avoided.

Yet a further example trigger criterion includes a signal indicative of a connection status of the DC power supply 111 towards the battery 113. For example, a situation may be encountered where the switch 112 is in a non-conductive state; then, the battery 113 cannot act as a sink for energy provided by the excitation coil 103, e.g., due to a BEMV being induced in generating state. Then, there may be an increased likelihood of damage to electrical components connected to the DC power supply 111. Hence, when detecting that the switch 112 is in non-conductive state, it may be helpful to discharge the excitation coil 103, to reduce the BEMV.

Yet a further example trigger criterion includes a signal indicative of loss of electrical energy, e.g., in the DC power supply 111 or at the battery 113 or in the circuit 121, 2013, 2012.

As a general rule, the device 181 may be implemented differently in different scenarios. For example, the device 181 could be an electric motor. Here, the magnetic material 182 may be attached to the stator or the rotor; then, by polarizing the magnetic material 182, a large flux coupling between the stator and the rotor can be achieved. The strength of the flux coupling and, hence, the BEMV, can be tailored by tailoring the field strength of the magnetic field 183. In turn, the field strength of the magnetic field 183 can be tailored by charging and discharging the excitation coil 103. Aspects with respect to the BEMV for an example implementation of the device 181 as an electric motor are described in connection with FIG. 2.

Figure 2:
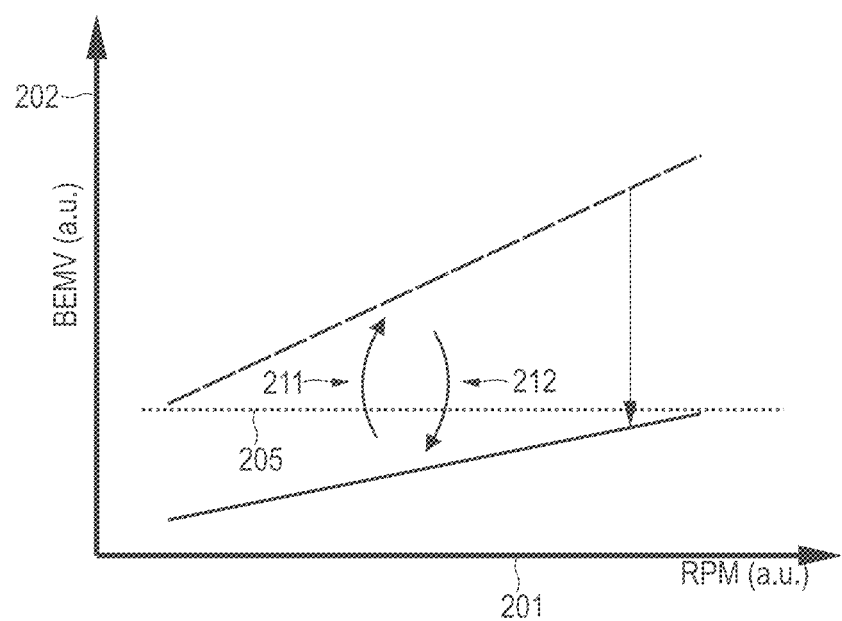
FIG. 2 schematically illustrates the BEMV for different motor speeds and different polarizations of the magnetic material according to various examples.

FIG. 2 illustrates aspects with respect to the BEMV 202. Specifically, FIG. 2 illustrates the BEMV 202 as a function of a speed 201 of the electric motor 181. As illustrated in FIG. 2, there is a tendency that the BEMV 202 increases for increasing speed 201.

FIG. 2 also illustrates aspects with respect to a dependency of the BEMV 202 on the current flow in the excitation coil 103. Specifically, FIG. 2 illustrates the BEMV for a zero current flow (full line) and for a maximum current flow (dashed line). As illustrated in FIG. 2, there is a tendency that a larger current flow in the excitation coil 103 results in a larger BEMV.

To increase the current flow in the excitation coil 103, the ascending transition 211 is activated. The ascending transition 211 includes charging of the excitation coil 103. Charging of the excitation coil 103—i.e., an ascending slope of the current flow—includes increasing the energy stored by the excitation coil 103. By increasing the energy stored in the excitation coil 103, the current flow in the excitation coil 103 is increased. Hence, the ascending transition 211 can be associated with a movement from the lower full line towards the upper dashed line in FIG. 2. Conversely, to decrease the current flow in the excitation coil 103, the descending transition 212 is activated. The descending transition 212 includes discharging of the excitation coil 103. Discharging of the excitation coil 103 includes decreasing the energy stored by the excitation coil 103. By decreasing the energy stored in the excitation coil 103, the current flow in the excitation coil 103 is decreased. Hence, the descending transition 212 can be associated with a movement from the upper dashed line to the lower full line in FIG. 2.

FIG. 2 also illustrates aspects with respect to a threshold BEMV 205 (dotted line). As illustrated in FIG. 2, for non-zero current flows, the BEMV 202 can cross the threshold BEMV 205. Then, an overvoltage may be fed back to the DC power supply in which may result in damage to electrical components connected to the DC power supply 111.

According to various examples, a large discharge rate can be implemented. The discharge rate can correlate with the change of the current flow in the excitation coil 103 per time unit. By implementing a large discharge rate, it would be possible to, e.g., quickly move from the dashed line in FIG. 2 to the full line in FIG. 2 (illustrated by the vertical arrow). A large discharge rate can be achieved for discharging.

Figure 3:
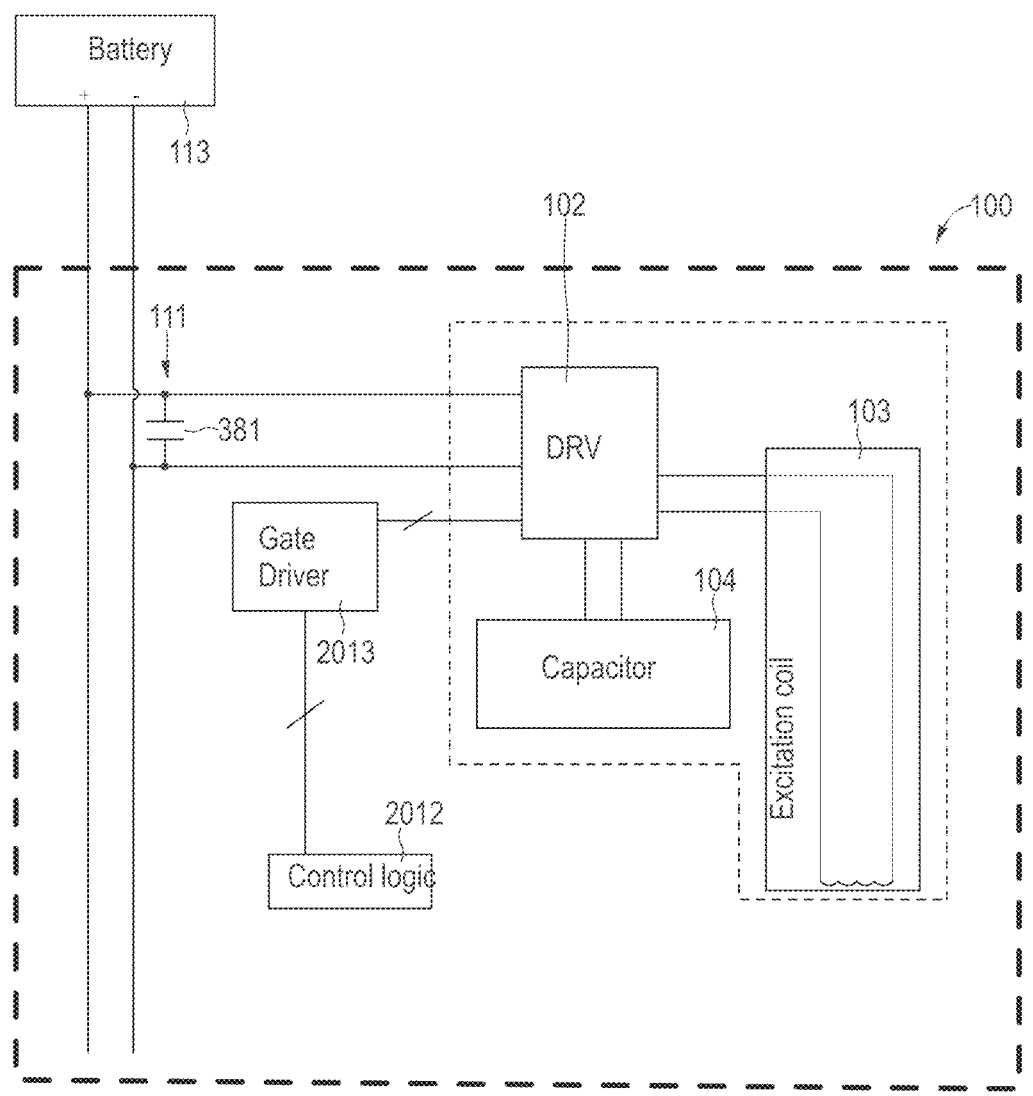
FIG. 3 schematically illustrates the circuit for polarizing magnetic material according to various examples.

FIG. 3 illustrates aspects with respect to the circuit 100. FIG. 3 illustrates an example implementation of the circuit 100. In the scenario of FIG. 3, the control circuitry 121 is implemented by control logic 2012 and a gate driver 2013. The DC power supply 111 is implemented by electrical traces from the battery 113 and a capacitor 381.

Figure 4:
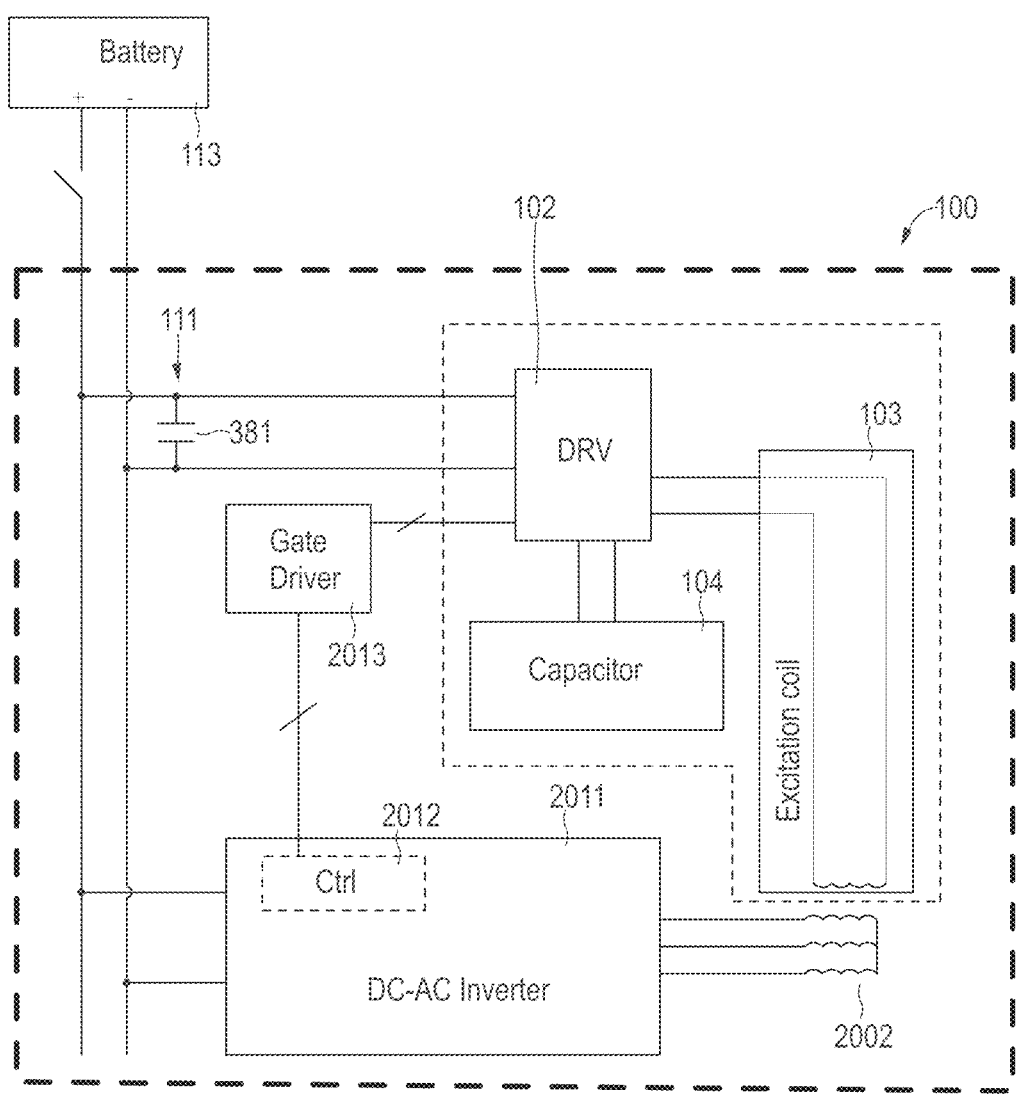
FIG. 4 schematically illustrates the circuit for polarizing magnetic material according to various examples.

FIG. 4 illustrates aspects with respect to the circuit 100. The scenario of FIG. 4 illustrates another example implementation of the circuit 100. In the example of FIG. 4, the control logic 2012 is part of a DC-AC inverter 2011. The DC-AC inverter 2011 is configured to apply FOC to drive phase windings 2002 of a motor. The excitation coil 103 is also arranged in the motor.

Figure 5A:
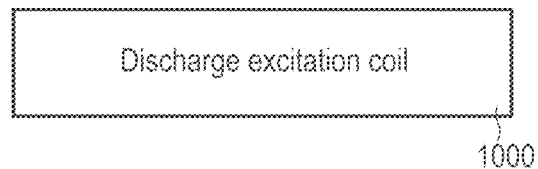
FIG. 5A is a flowchart of a method according to various examples.

FIG. 5A is a flowchart of a method according to various examples. FIG. 5A illustrates aspects with respect to discharging an excitation coil, e.g., the excitation coil 103 of FIG. 1. In block 1000, the excitation coil is discharged via at least one capacitor. Thereby, energy can be transferred from the excitation coil to the at least one capacitor. A commutation circuitry is implemented by the excitation coil and the at least one capacitor. When commencing discharging, a polarity of the voltage across the excitation coil may be opposite to a polarity of the voltage across each one of the at least one capacitor. The voltage across the excitation coil is increased. This increases the discharge rate. During the discharging of the excitation coil, the current flow through the excitation coil decreases toward zero. The fast discharging corresponds to one possible method of discharging an excitation coil.

Figure 5B:
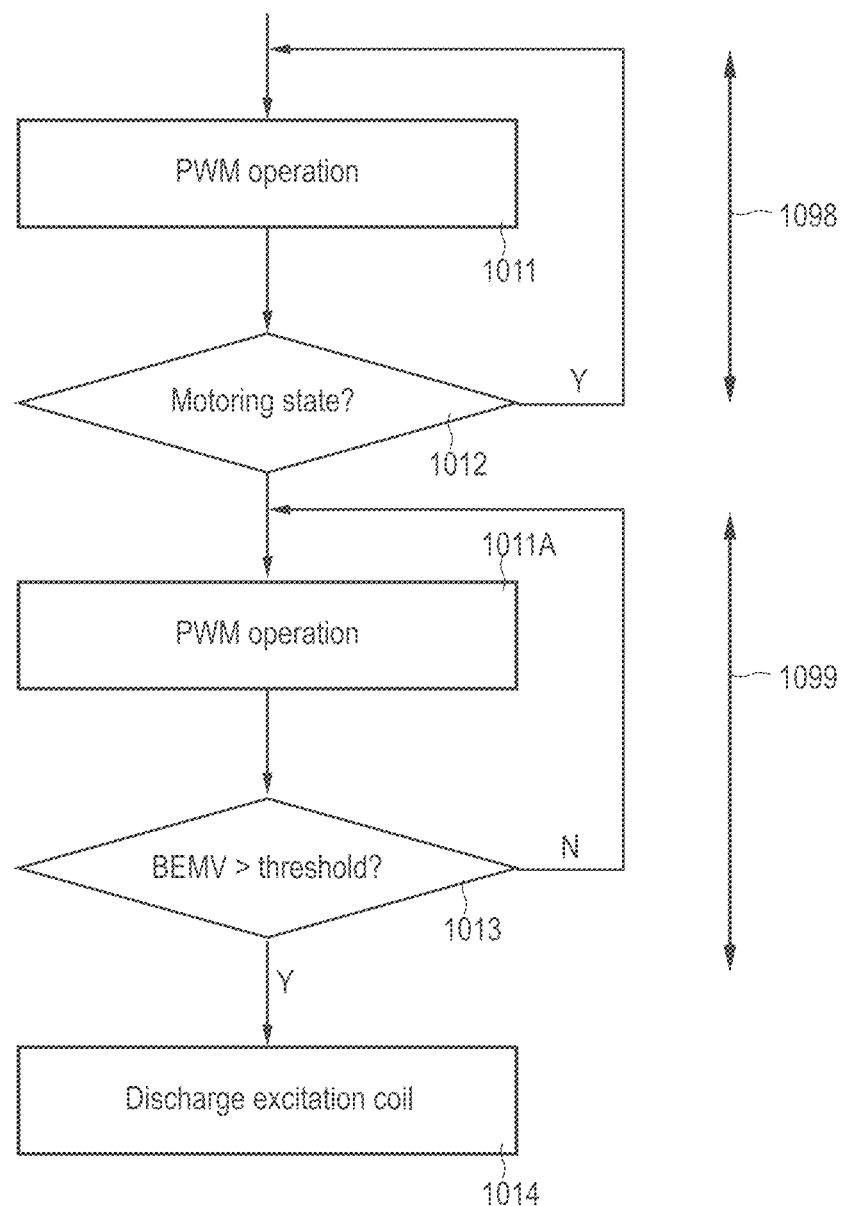
FIG. 5B is a flowchart of a method according to various examples, wherein the method includes a motoring state and a generating state.

FIG. 5B is a flowchart of a method according to various embodiments. The method according to FIG. 5B illustrates aspects with respect to different states in which the system 90 can be operated. Specifically, the method according to FIG. 5B illustrates operation in the motoring state 1098, as well as operation in the generating state 1099.

According to the example of FIG. 5B, the method commences with operation in the motoring state 1098. This involves PWM operation of the current flow in the excitation coil 103. For example, the excitation coil 103 can be periodically charged and discharged; i.e., it would be possible to alternatingly activate the charging mode and the discharging mode. Here, by varying a duty cycle of the charging mode and the discharging mode, it becomes possible to set the torque or speed 201 of the electric motor 181.

At block 1012, it is checked whether the motoring state should remain active. If the motoring state 1098 is to remain active, then execution of block 1011 is continued.

Otherwise, operation in the generating state 1099 commences. Operation in the generating state 1099 includes PWM operation at 1011A and checking if the BEMV 202 exceeds the threshold 205, block 1013. In the affirmative, block 1014 is executed. In block 1014, a fast discharging is activated, typically, until a zero current flow in the excitation coil 103 is reached (cf. FIG. 2). This provides for a fast discharge.

As a general rule, in block 1013 additional or alternative trigger criteria for activating the fast discharging associated with 1014 are available. For example, the state of the switch 112 may be considered. For example, alternative or additionally to considering the BEMV 202, a voltage measured at the DC power supply 111 may be taken into account.

Figure 6A:
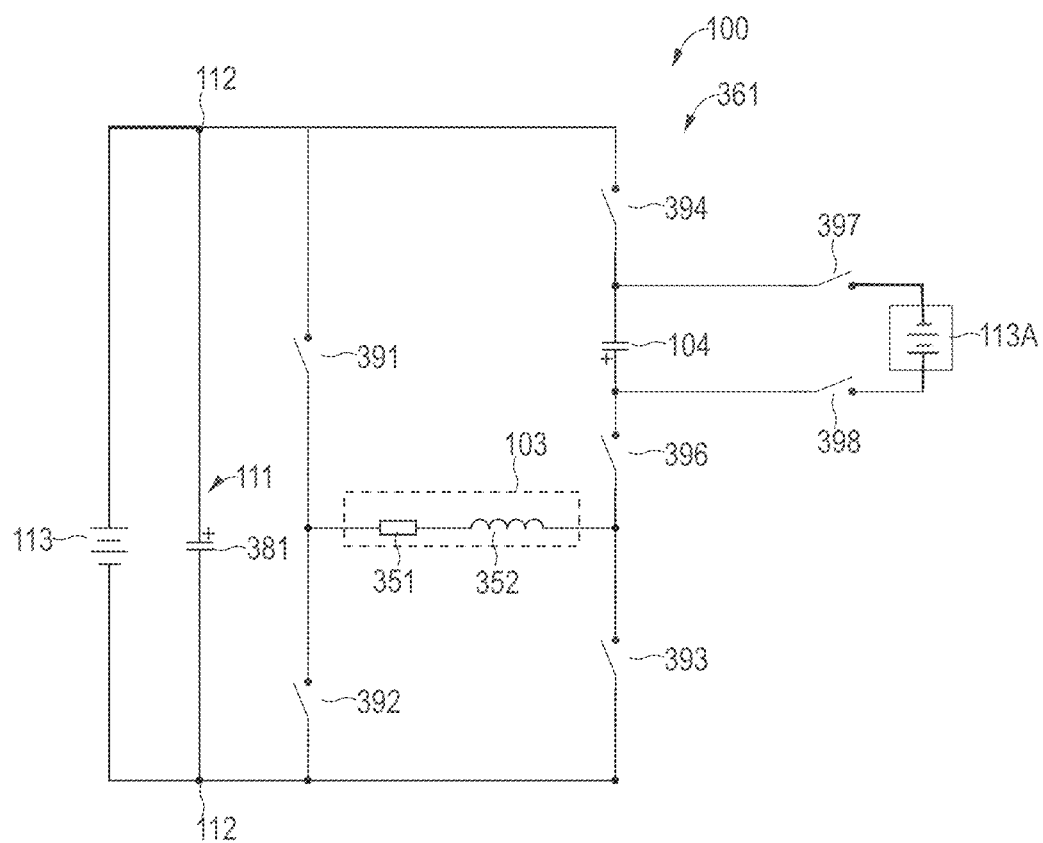
FIG. 6A schematically illustrates the circuit for polarizing magnetic material according to various examples, wherein the circuit includes an excitation coil and a capacitor.

FIG. 6A illustrates aspects with respect to the circuit 100. FIG. 6A illustrates an example implementation of the driver circuitry 102. The driver circuitry 102 is configured to operate the excitation coil 103 and the capacitor 104. As such, the driver circuitry 102 is configured to switch the current flow in the excitation coil 103 and the current flow in the capacitor 104.

In FIG. 6A, a scenario is illustrated, in which the driver circuitry 102 includes an H-bridge 361. The H-bridge 361 includes switches 391-394. The switches 391-394 may be implemented by transistors such as bipolar transistors, FETs, and/or diodes.

The H-bridge 361 is modified: the H-bridge 361 also includes a switch 396 and the capacitor 104. The switch 396 is connected in series between the excitation coil 103— including a corresponding resistivity 351 and an inductance 352—and the capacitor 104. The switch 396 facilitates selective decoupling of the capacitor 104 and the excitation coil 103. For example, the switch 396 could be implemented as a diode or as a FET or as a bipolar transistor.

For example, when operating the switch 396 and the switch 394 in the non-conductive states, it would be possible to charge the capacitor 104 to a predetermined voltage. The predetermined voltage is defined by a voltage source 113A.

The voltage source 113A is configured to charge the capacitor 104. For this, the voltage source 113A is connected to the capacitor 104. The voltage source 113A is connected to the capacitor 114 via switches 397, 398. A first terminal of the voltage source 113A is connected to the electrode of the capacitor 104 that is connected to and adjacent to the switch 394 via the switch 397. A second terminal of the voltage source 113A is connected to the other electrode of the capacitor 104, i.e., the electrode of the capacitor 104 that is connected to and adjacent to the switch 396, wherein this connection is via the switch 398.

Next, the function of the circuit 100 is explained.

Initially, the voltage across the capacitor 104 is zero. There is no current flow through the excitation coil 103.

Next, a first mode of operation is activated. The first mode of operation includes charging of the excitation coil 103. The first mode of operation also includes charging of the capacitor 104 to the predetermined voltage. In the first mode of operation, the switch 391 and the switch 393 are operated in the conductive state; the switch 392 and the switch 396 and the switch 394 are operated in a non-conductive state. Thereby, the excitation coil 103 is charged from the battery 113 via the DC power supply 111 and via the poll 112. The switches 397, 398 are operated in conductive state. Thereby, the capacitor 104 is charged by the voltage source 113A to the predetermined voltage. By operating the switch 396 in the non-conductive state, the charging of the capacitor 104 is decoupled from the charging of the excitation coil 103.

Next, a second mode of operation is activated. Here, the switches 391, 393 are operated in the non-conductive state and the switches 392, 394, 396 are operated in the conductive state. The switches 397, 398 are operated in the non-conductive state. This corresponds to a series connection of the excitation coil 103 and the capacitor 104 with respect to the port 112. Thereby, the excitation coil 103 is discharged via the capacitor 104 to the DC power supply 111 via the port 112.

While in the scenario of FIG. 6A the voltage source 113A is illustrated separately from the battery 113, it is generally possible that the battery 113 and, hence, the DC power supply 111 are also used to charge the capacitor 104. Such a scenario may benefit from a parallel connection of the excitation coil 103 and the capacitor 104 during charging of the excitation coil 103. Such a scenario is illustrated in connection with FIG. 6B.

Figure 6B:
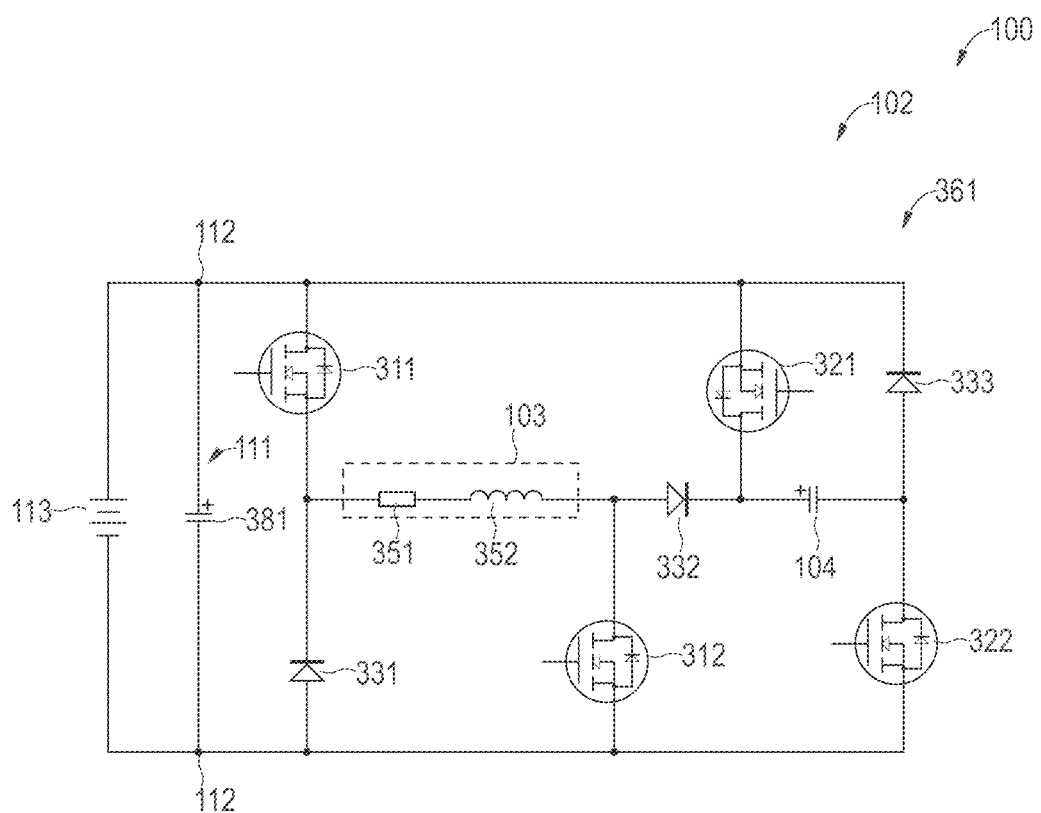
FIG. 6B schematically illustrates the circuit for polarizing magnetic material according to various examples, wherein the circuit includes an excitation coil and a capacitor.

FIG. 6B illustrates aspects with respect to the circuit 100 FIG. 6B illustrates an example implementation of the driver circuitry 102. The driver circuitry 102 is configured to operate the excitation coil 103 and the capacitor 104. As such, the driver circuitry 102 is configured to switch the current flow in the excitation coil 103 and the current flow in the capacitor 104.

In FIG. 6B, a scenario is illustrated, in which the driver circuitry 102 includes an H-bridge 361 implemented by the switches 311, 333, 331, 312. The H-bridge 361 is modified. The H-bridge 361 also includes the diode 332, the switches 312, 321, and the capacitor 104. A series connection of the excitation coil 103 and the capacitor 104 via the diode 332 may be achieved.

The switch 311 is connected with an input terminal of the excitation coil 103; and the switch 312 is connected with an output terminal of the excitation coil 103.

The switch 321 is connected with the DC power supply 111, as well as with the capacitor 104. The switch 322 is connected with the capacitor 104 and the DC power supply 111. The positive polarity of the capacitor 104 is connected with the negative polarity of the diode 332 and the switch 321. The negative polarity of the capacitor 104 is connected with the switch 322 and the positive polarity of the diode 333.

As a general rule, it would be possible to replace one or more of the diodes 331, 332, and 333 by transistors.

Figure 7:
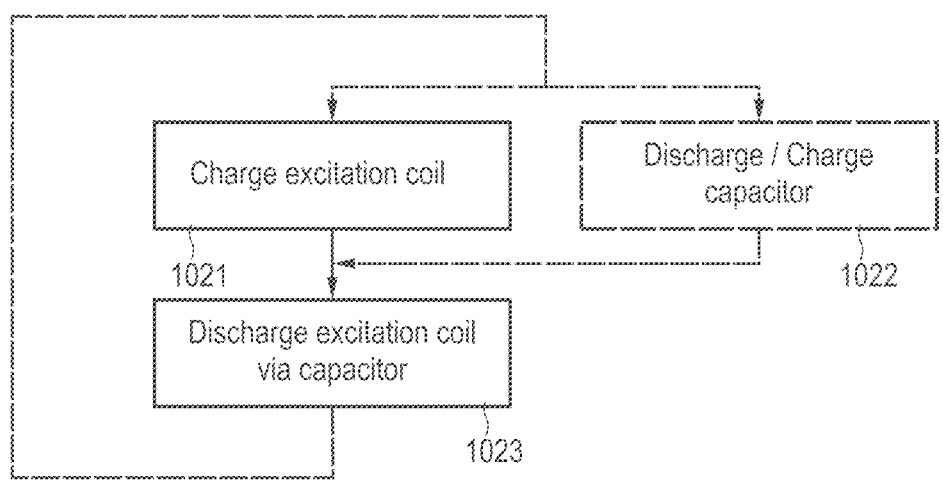
FIG. 7 is a flowchart of a method according to various examples.

FIG. 7 is a flowchart of a method according to various examples. FIG. 7 illustrates aspects with respect to the operation of the circuit 100 and, specifically, the driver circuitry 102 in connection with the excitation coil 103 and the capacitor 104. For example, the method according to FIG. 7 may be executed by the driver circuitry 102 and/or the control circuitry 121.

FIG. 7 illustrates aspects with respect to the charging mode, as well as with respect to the discharging mode. FIG. 7 illustrates a scenario where the charging mode and the discharging mode are alternatingly activated. This may be, e.g., in accordance with a PWM timing, e.g., as part of block 1011 and block 1011A of FIG. 5B. Alternatively, this may be in response to detecting that the BEMV crosses the threshold in generating state 1099, i.e., in accordance with blocks 1013-1014. Here, it is not required to switch back to activation of the charging mode (hence, the respective arrow is marked as optional by using dashed lines in FIG. 7; cf. block 1023 of FIG. 7).

The charging mode includes charging of the excitation coil (block 1021). The charging mode, optionally, also includes charging or discharging of the capacitor 104 (block 1022). For example, the capacitor 104 may be charged when a voltage across the capacitor 104 is smaller than a predetermined voltage such as the voltage provided by the DC power supply; and the capacitor 104 may be discharged when the voltage across the capacitor is larger than the predetermined voltage (cf. FIG. 6A: power supply 113A; and cf. FIG. 6B: battery 113).

The discharging mode includes discharging of the excitation coil 103 via the capacitor 104 (block 1023).

Figure 8:
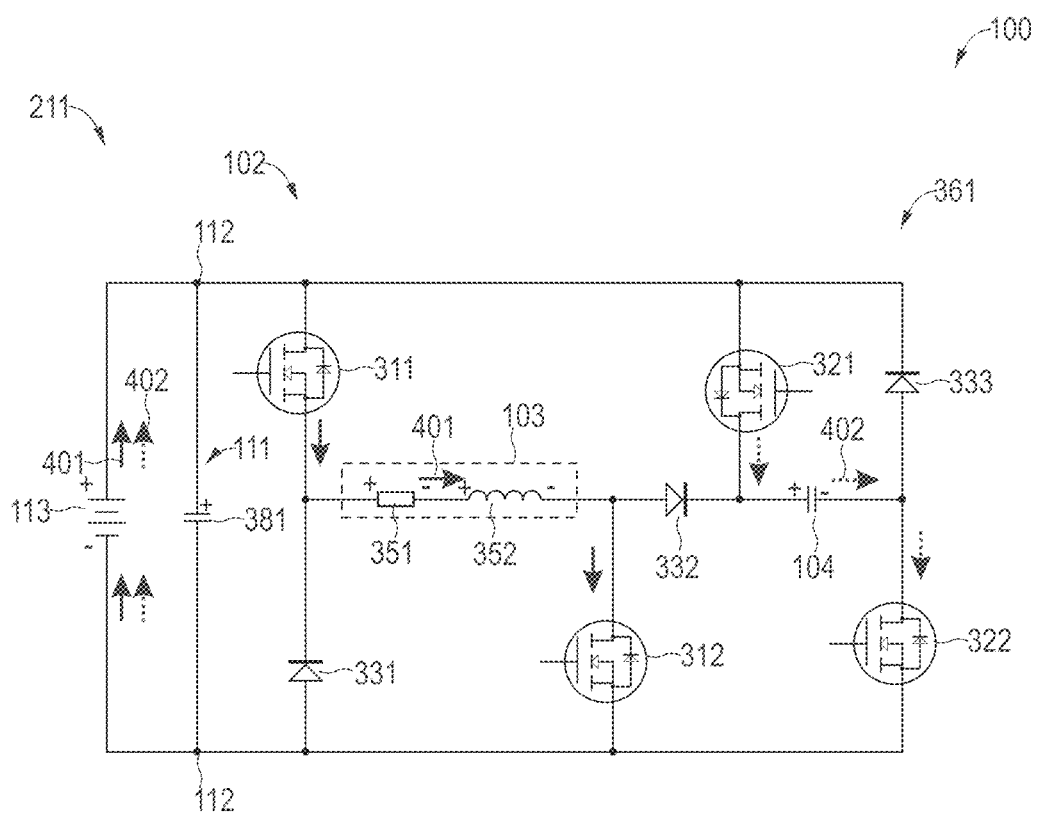
FIG. 8 schematically illustrates current flow in the circuit of FIG. 6B in a charging mode.
Figure 9:
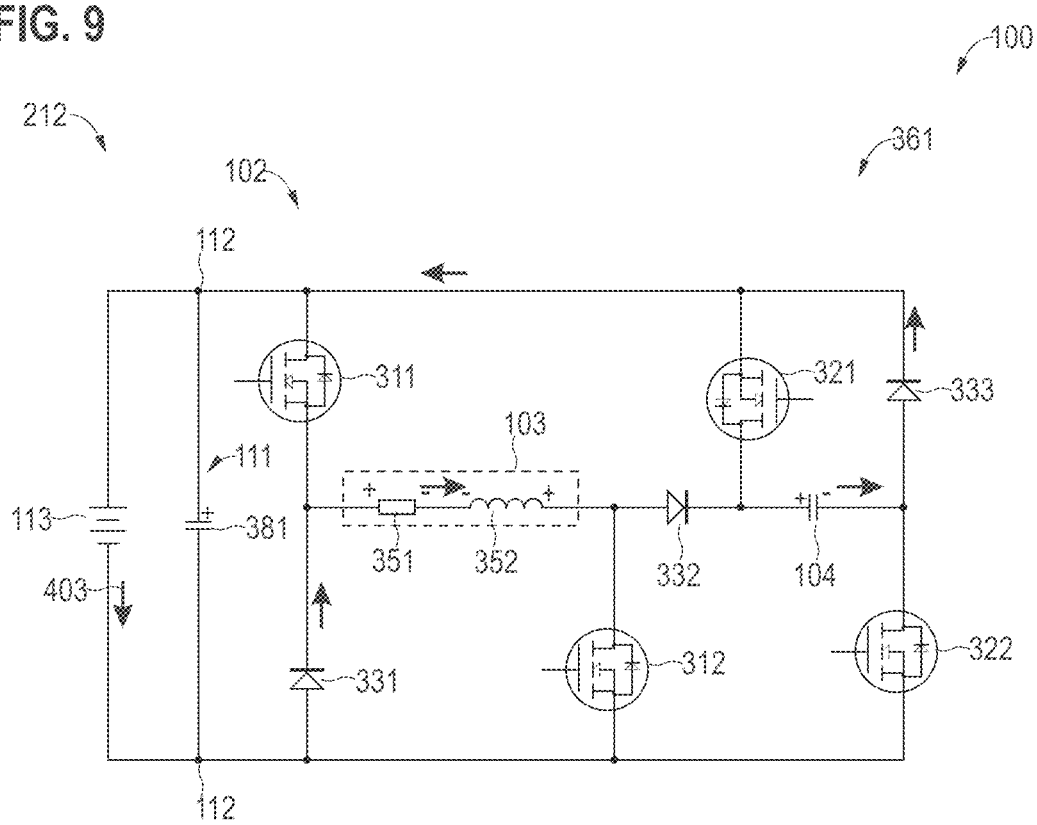
FIG. 9 schematically illustrates current flow in the circuit of FIG. 6B in a discharging mode.
Figure 10:
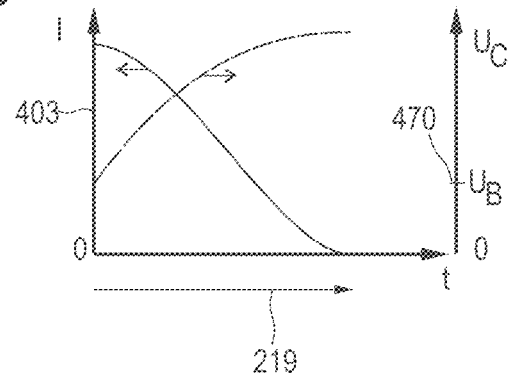
FIG. 10 schematically illustrates a time dependency of a current flow in the excitation coil of the circuit of FIG. 6B and a voltage across the capacitor of the circuit of FIG. 6B.

Details of the charging mode and the discharging mode are explained with respect to FIG. 8, FIG. 9 and FIG. 10.

FIG. 8 illustrates aspects with respect to the circuit 100. FIG. 8 corresponds to the scenario FIG. 6B. Specifically, FIG. 8 illustrates aspects with respect to the function of the circuit 100.

FIG. 8 illustrates aspects with respect to the function of the circuit 100 in charging mode. Specifically, FIG. 8 illustrates a current flow 401 in the excitation coil 103 (illustrated using full arrows in FIG. 8). Further, FIG. 8 illustrates a current flow 402 in the capacitor 104.

The current flows 401, 402 are provided by the battery 113 via the DC power supply 111. As illustrated in FIG. 8, the switches 311, 312 are operated in a conductive state. Likewise, the switches 321, 322 are operated in a conductive state. Hence, the excitation coil 103 and the capacitor 104 are connected in parallel in the charging mode. The current flow 401 is used to charge the excitation coil 103. The current flow 402 is used to charge the capacitor 104.

FIG. 8 illustrates a scenario in which the voltage across the capacitor is smaller than the DC supply voltage between high-side and low side of the DC power supply 111. When the voltage across the capacitor 104 is smaller than the DC supply voltage, the capacitor 104 is charged as illustrated in FIG. 8, by means of the current flow 402—until eventually the voltage across the capacitor 104 reaches the DC supply voltage. When the voltage across the capacitor 104 is larger than the DC supply voltage, then the capacitor 104 is discharged to the DC power supply 111 (not illustrated in FIG. 8). This helps to reduce the overall energy consumption of the system 90, since energy is not dissipated but recovered.

As a general rule, while in FIG. 8 the capacitor 104 is charged from the battery 113 via the DC power supply, in other examples, the capacitor 104 may be charged to an arbitrary predetermined voltage, by providing an appropriate further DC power supply (cf. DC power supply 113A in FIG. 6A).

When commencing charging of the capacitor 104 at the beginning of the charging mode, there can be an inrush current spike. If the battery supports such inrush current spikes, then charging of the excitation coil 103 is not affected. A choke may be provided to mitigate the inrush current spikes. Otherwise, the charging of the excitation coil 103 can be affected to some degree by the charging of the capacitor 104. Beyond this, a decoupling of charging of the capacitor 104 and the excitation coil 103 is achieved by the diode 332 and the parallel connection of the capacitor 104 and the excitation coil 103 between high-side and low-side of the DC power supply 111. Once a steady state has been adhered, a constant, predetermined voltage is observed across the capacitor 104 which corresponds to the DC supply voltage provided by the battery 113. A current flow through the excitation coil 103 is also observed. The current flow is defined inter alia by the resistivity 351.

FIG. 9 illustrates aspects with respect to the circuit 100. FIG. 9 corresponds to the scenario of FIGS. 6B and 8. Specifically, FIG. 9 illustrates aspects with respect to the function of the circuit 100.

FIG. 9 illustrates aspects with respect to the function of the circuit 100 in discharging mode. Specifically, FIG. 9 illustrates a current flow 403 in the excitation coil 103. The current flow 403 is via the capacitor 104. Hence, in the discharging mode, the excitation coil 103 and the capacitor 104 are connected in series. This corresponds to a commutation circuitry. The excitation coil 103 is discharged to the DC power supply 111 via the capacitor 104. For example, if the discharging mode is associated with the generating state 1099 (cf. FIG. 5B), then, the discharging mode may be activated until the current flow 403 reaches zero (cf. full line in FIG. 2).

Next, the observed effect of the reduced discharging time when employing the capacitor 104 will be motivated. The discharging rate is given by:

$$U_L = L\frac{dI}{dt}, \quad (1)$$

where $U_L$ is the voltage across the excitation coil 103; L is the inductance 352 of the excitation coil 103; and $|dI/dt|$ is the discharging rate.

The voltage across the excitation coil 103 is given by:

$$U_L = U_C + U_B + U_R, \quad (2)$$

where UC is the voltage across the capacitor 104; UB is the battery voltage of the battery 113;
and UR is the voltage across the resistor 351.

Here, the voltage drops across the diodes 331, 332, and 333 has been neglected for sake of simplicity. The polarity of the voltages of equation 2 is illustrated in FIG. 9. As will be appreciated from a comparison of equations (1) and (2), the discharge rate is increased by provisioning the capacitor 104, if compared to reference implementations without the capacitor 104 where UC=0 V (considering that battery voltage and the voltage across the resistor are the same for the reference implementation and the current implementation). Typically, the resistor 351 can have a resistance in the range of R=1-20Ω.

The polarity of the voltage across the excitation coil 103 opposes the polarity of the voltage across the capacitor 104 (also illustrated in FIG. 9). Thus, the voltage across the capacitor 104 increases the voltage across the excitation coil 103. This helps to increase the discharging rate.

The voltage across the capacitor 104 depends on the capacity of the capacitor 104. As a general rule, the capacity may be in the range of 1 μF-1 mF, optionally in the range of 10 μF-700 μF. Then, voltages across the capacitor may range approximately from $U_C$=50 V-1000V. Typically, larger values for UC Will result in a higher discharge rate. Hence, larger values for UC can shorten the discharge time.

Typical discharge times observed using such techniques amounted to 1 ms-10 ms. Typically, such discharge times are sufficiently short to avoid damage to electronic components due to excessive overvoltage on the DC power supply 111.

FIG. 10 illustrates aspects with respect to the voltage—current time dependency in the discharging mode with enough duration. Specifically, FIG. 10 illustrates the current flow 403 in the excitation coil 103 as a function of time in the discharge mode (the current flow 403 is illustrated using the full line and the left axis in FIG. 10). As illustrated, the current flow 403 reduces from a maximum value to zero within the discharge time 219. The discharge time 219 is shortened compared to scenarios where there is no capacitor 104 provided. This is because the discharge rate is increased.

FIG. 10 illustrates the voltage across the capacitor 104 as a function of time and the discharging mode (the voltages illustrated using the dashed line and the right axis in FIG. 10).

As illustrated, the voltage across the capacitor initially increases from a predetermined voltage 470. The predetermined voltage may comprise the voltage of the DC power supply in/the battery 113 (cf. FIG. 6B) or the voltage of a further DC power supply 113A (cf. FIG. 6A). Then, the voltage of the capacitor 104 reaches the maximum at the moment that the excitation coil current decreases to zero.

From FIG. 10, it is apparent that the current flow 403 descends/decreases in the discharging mode. The current flow 403 correspondingly ascends/increases in the charging mode (not illustrated in FIG. 10). The current flow 403 in the excitation coil 103 is positively related to the energy stored in the excitation coil 103. This is because the magnetic field generated by the excitation coil 103 is proportional to the current flow 403 in the excitation coil 103. Hence, the charging mode includes increasing the energy stored in the excitation coil 103 and the discharging mode includes decreasing the energy stored in the excitation coil 103.

To further reduce the discharge time 219, it would be possible to complement such techniques of discharging the excitation coil 103 via the capacitor 104 with a FOC flux weakening techniques. This can be achieved by using the DC-AC inverter 2011, according to the example of FIG. 4.

Figure 11:
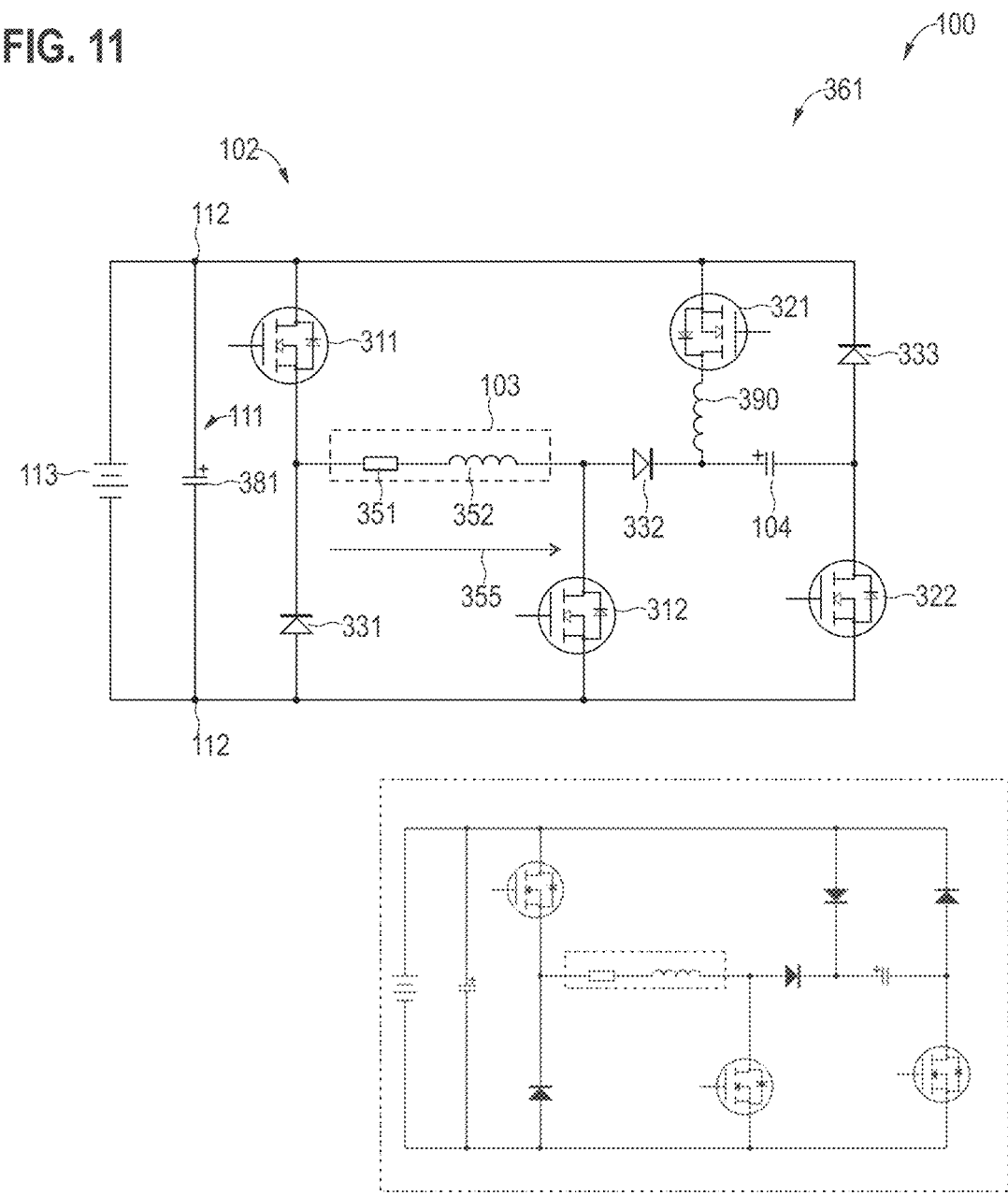
FIG. 11 schematically illustrates the circuit for polarizing magnetic material according to various examples.

FIG. 11 illustrates aspects with respect to the circuit loft FIG. 11 illustrates an example implementation of the driver circuitry 102. The scenario of FIG. 1i generally corresponds to the scenario of FIG. 6B. In the scenario of FIG. 11, the circuit 100 includes a choke 390. The choke 390 is connected in series with the switch 321 and the capacitor 104. The choke helps to reduce the peak current flow 402 in the charging mode. Current spikes are avoided. The choke 390 can be helpful where the turn-on-time of the switches 321, 322 cannot be freely controlled.

The inset of FIG. 11 illustrates a scenario in which the switch 321 is implemented by a diode.

Figure 12:
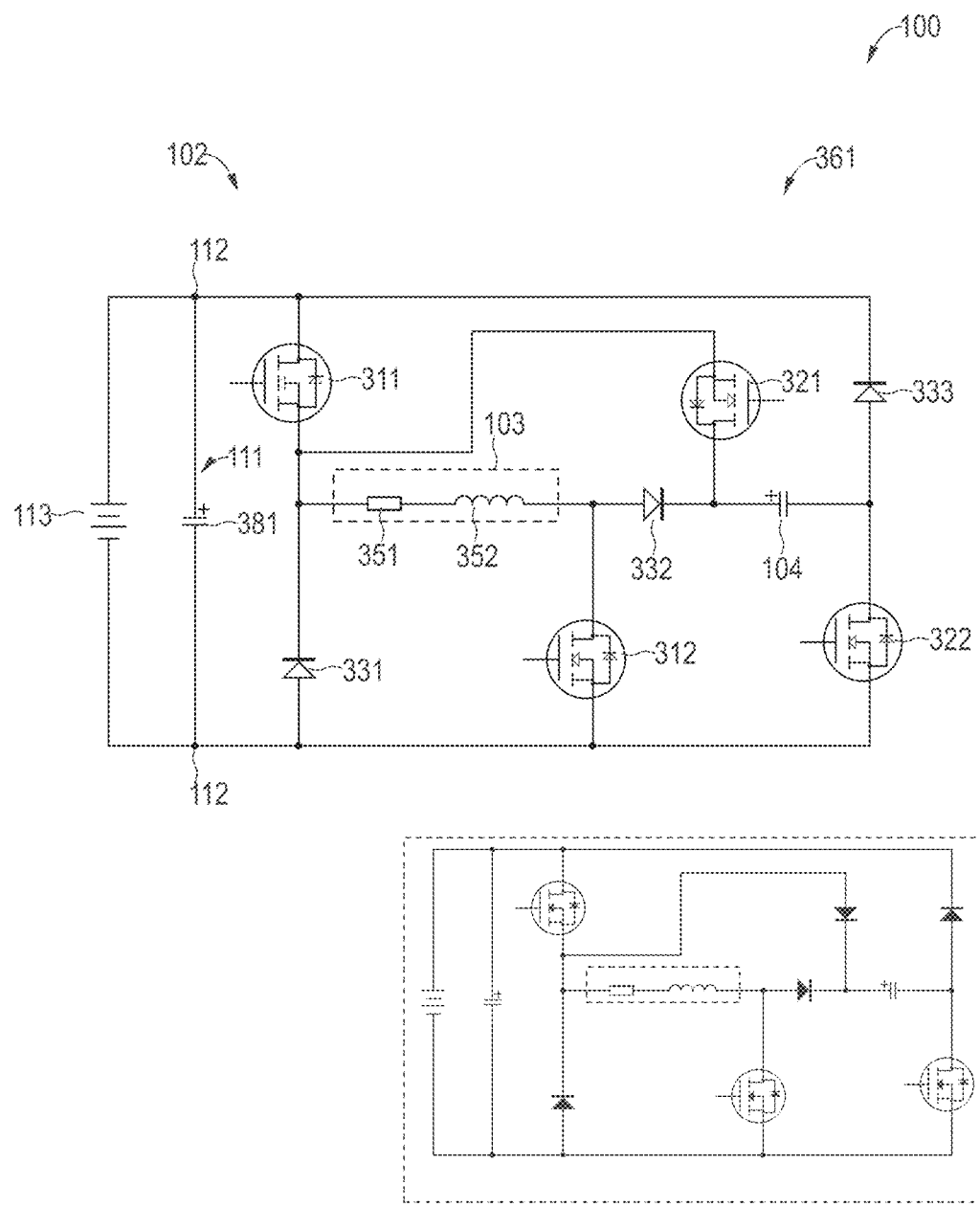
FIG. 12 schematically illustrates the circuit for polarizing magnetic material according to various examples.

FIG. 12 illustrates aspects with respect to the circuit 100. FIG. 12 illustrates an example implementation of the driver circuitry 102. The scenario FIG. 12 generally corresponds to the scenario FIG. 6B. In the scenario FIG. 12, the switch 321 is not directly connected with the DC power supply 111 and the port 112; but rather connected via the switch 311.

The inset of FIG. 12 illustrates a scenario in which the switch 321 is implemented by a diode.

Figure 13:
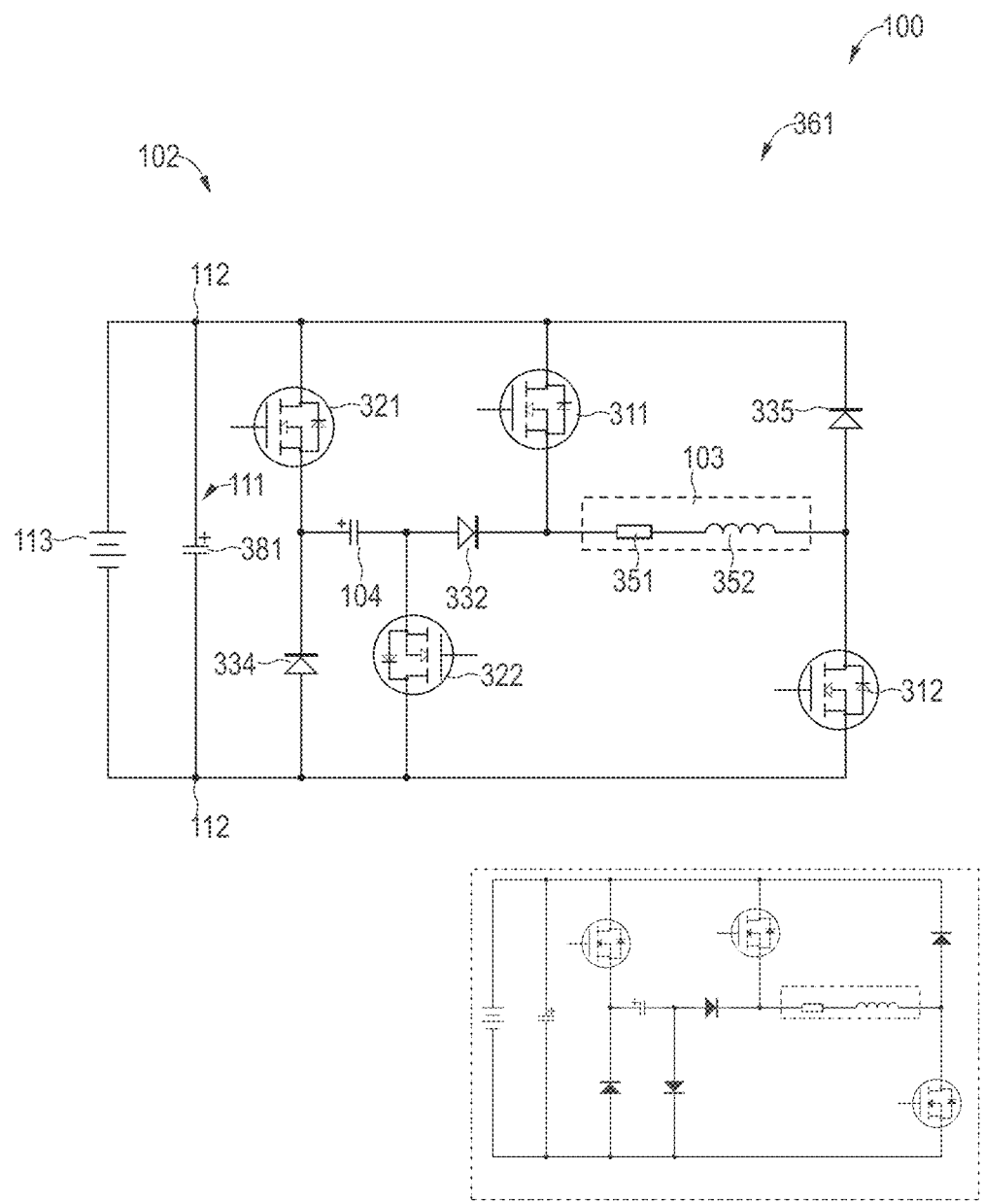
FIG. 13 schematically illustrates the circuit for polarizing magnetic material according to various examples.

FIG. 13 illustrates aspects with respect to the circuit 100. FIG. 13 illustrates an example implementation of the driver circuitry 102. The scenario FIG. 13 generally corresponds to the scenario FIG. 6B. In the scenario FIG. 13, the arrangement of capacitor 104 and the excitation coil 103 is exchanged if compared to the scenario FIG. 6B.

The inset of FIG. 13 illustrates a scenario in which the switch 322 is implemented by a diode.

Figure 14:
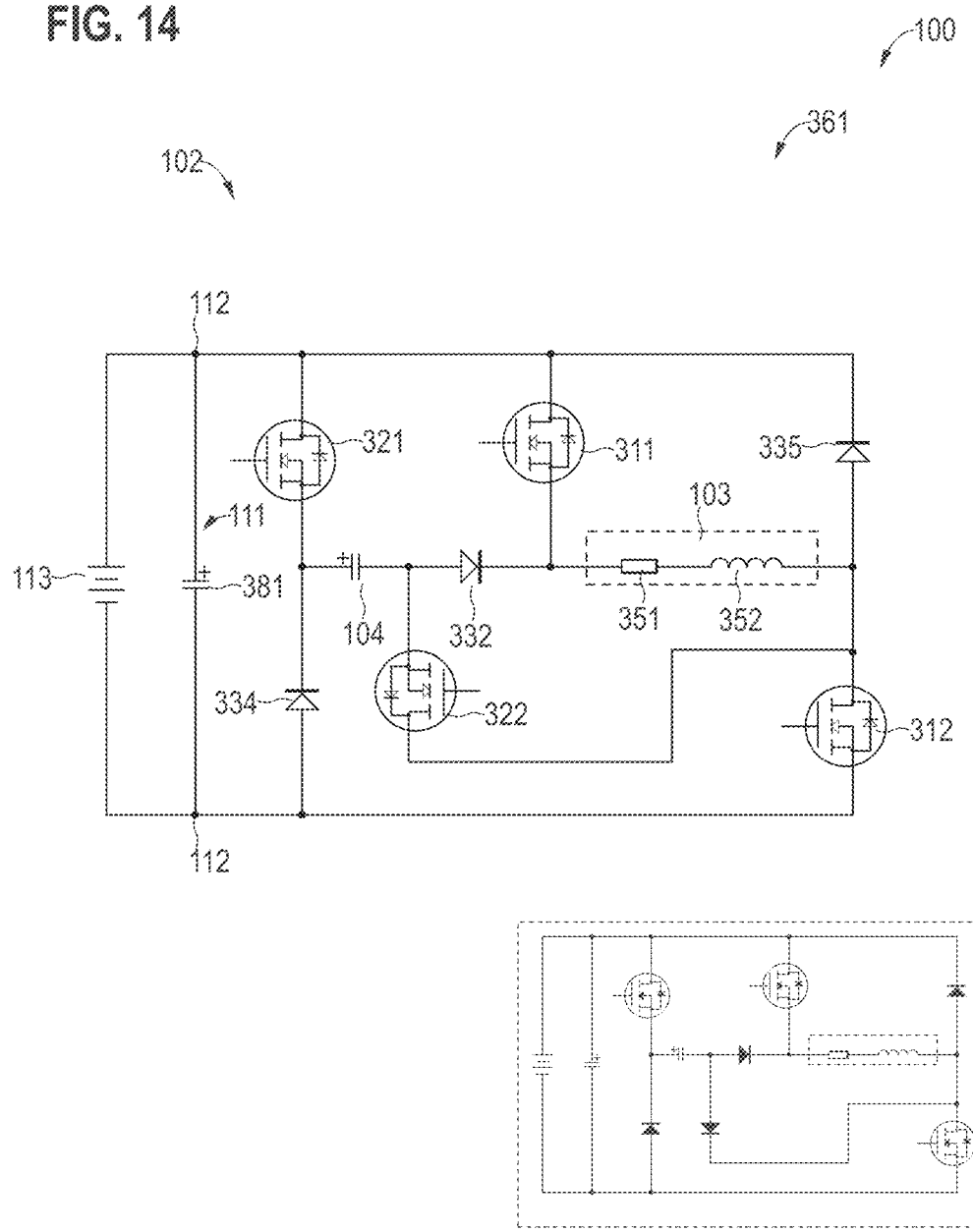
FIG. 14 schematically illustrates the circuit for polarizing magnetic material according to various examples.

FIG. 14 illustrates aspects with respect to the circuit 100. FIG. 14 illustrates an example implementation of the driver circuitry 102. The scenario FIG. 14 generally corresponds to the scenario of FIG. 6B. In the scenario FIG. 14, the switch 322 is not directly connected with the DC power supply 111 and the poll 112; but rather connected via the switch 312.

The inset of FIG. 14 illustrates a scenario where the switch 322 is replaced by a diode.

Figure 15:
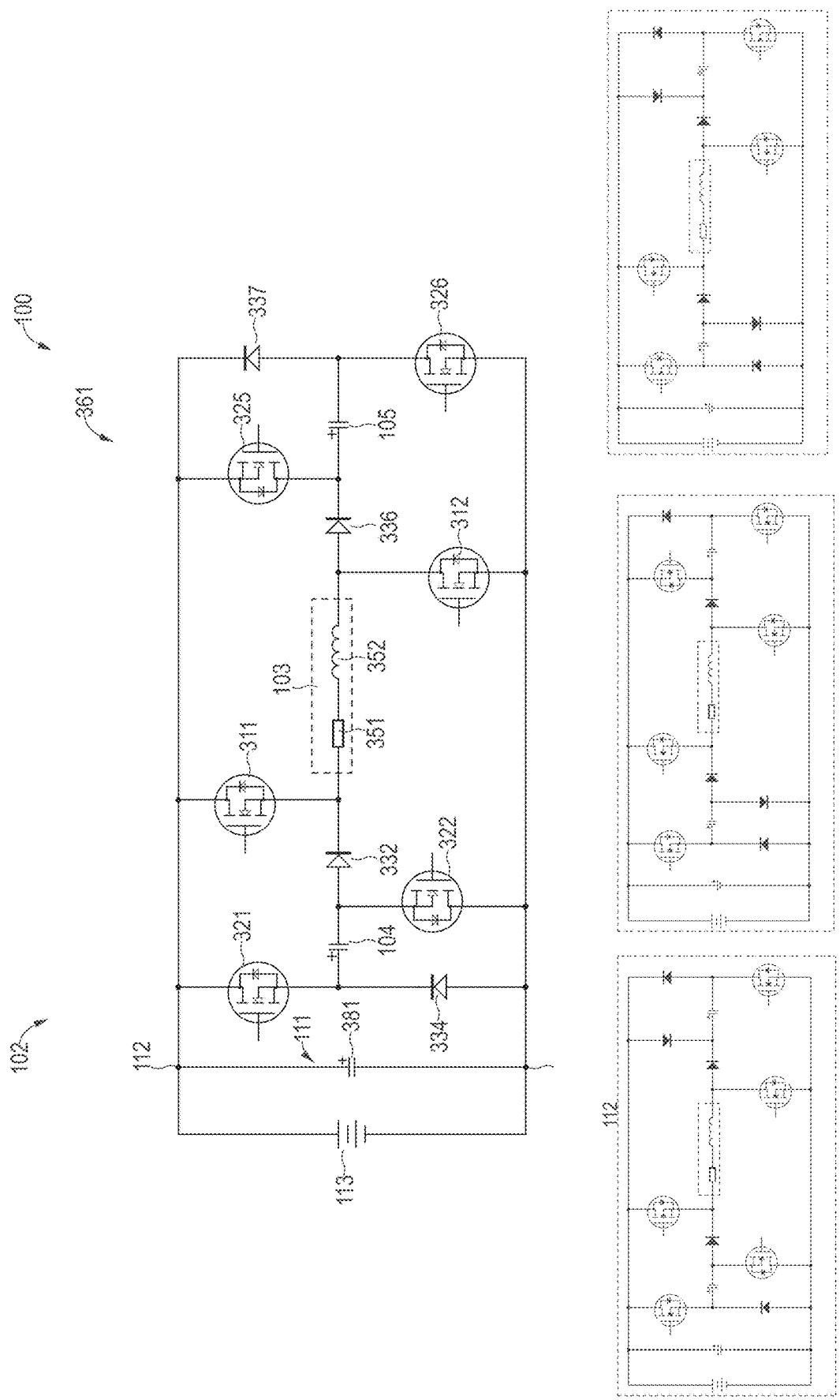
FIG. 15 schematically illustrates the circuit for polarizing magnetic material according to various examples.

FIG. 15 illustrates aspects with respect to the circuit 100. FIG. 15 illustrates an example implementation of the driver circuitry 102. The scenario of FIG. 15 generally corresponds to the scenario of FIG. 13. In the scenario of FIG. 15, an additional switch 325, switch 326, and diode 337 are provided. The switches 325, 326 and the diode 337 are associated with the capacitor 105.

As a general rule, multiple capacitors 104, 105 may be provided. Each capacitor may be operated by an associated one or more switches. By using two or more capacitors 104, 105, it is possible to further reduce the discharge time 219. The voltage across the excitation coil 103 is further increased. The excitation coil 103 is arranged in between the capacitors 104, 105.

The inset of FIG. 15 illustrates a scenario where the switch 325 is implemented by a diode. A further inset of FIG. 15 illustrates a scenario where the switch 322 is implemented by a diode. It would also be possible to implement both the switch 322, as well as the switch 325 by a diode. See further inset.

Figure 16:
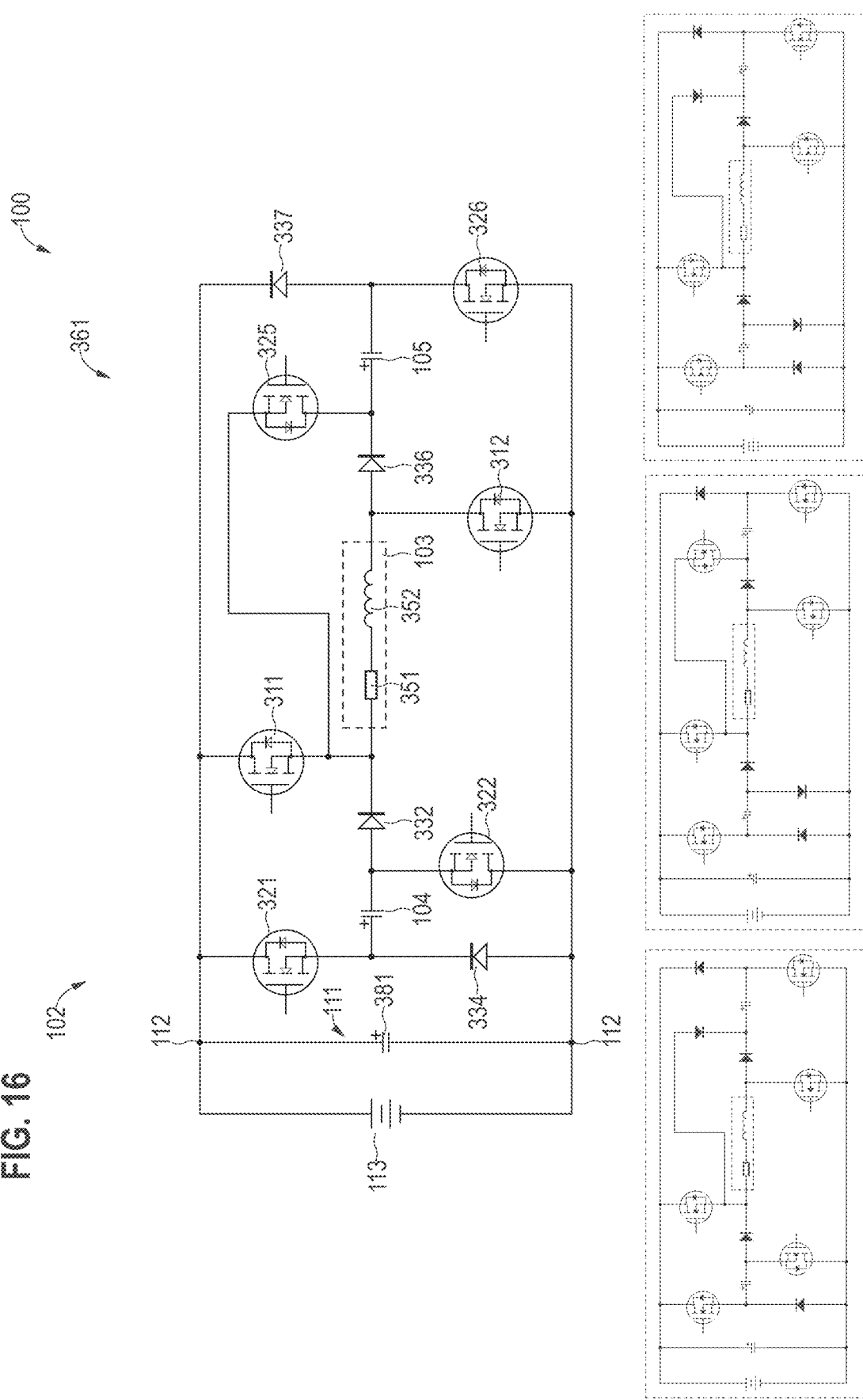
FIG. 16 schematically illustrates the circuit for polarizing magnetic material according to various examples.

FIG. 16 illustrates aspects with respect to the circuit loft FIG. 16 illustrates an example implementation of the driver circuitry 102. The scenario of FIG. 16 essentially corresponds to a combination of the scenario of FIG. 15 and the scenario of FIG. 12.

The inset of FIG. 16 illustrates a scenario where the switch 325 is implemented by a diode. A further inset of FIG. 16 illustrates a scenario where the switch 322 is implemented by a diode. It would also be possible to implement both the switch 322, as well as the switch 325 by a diode. See further inset.

Figure 17:
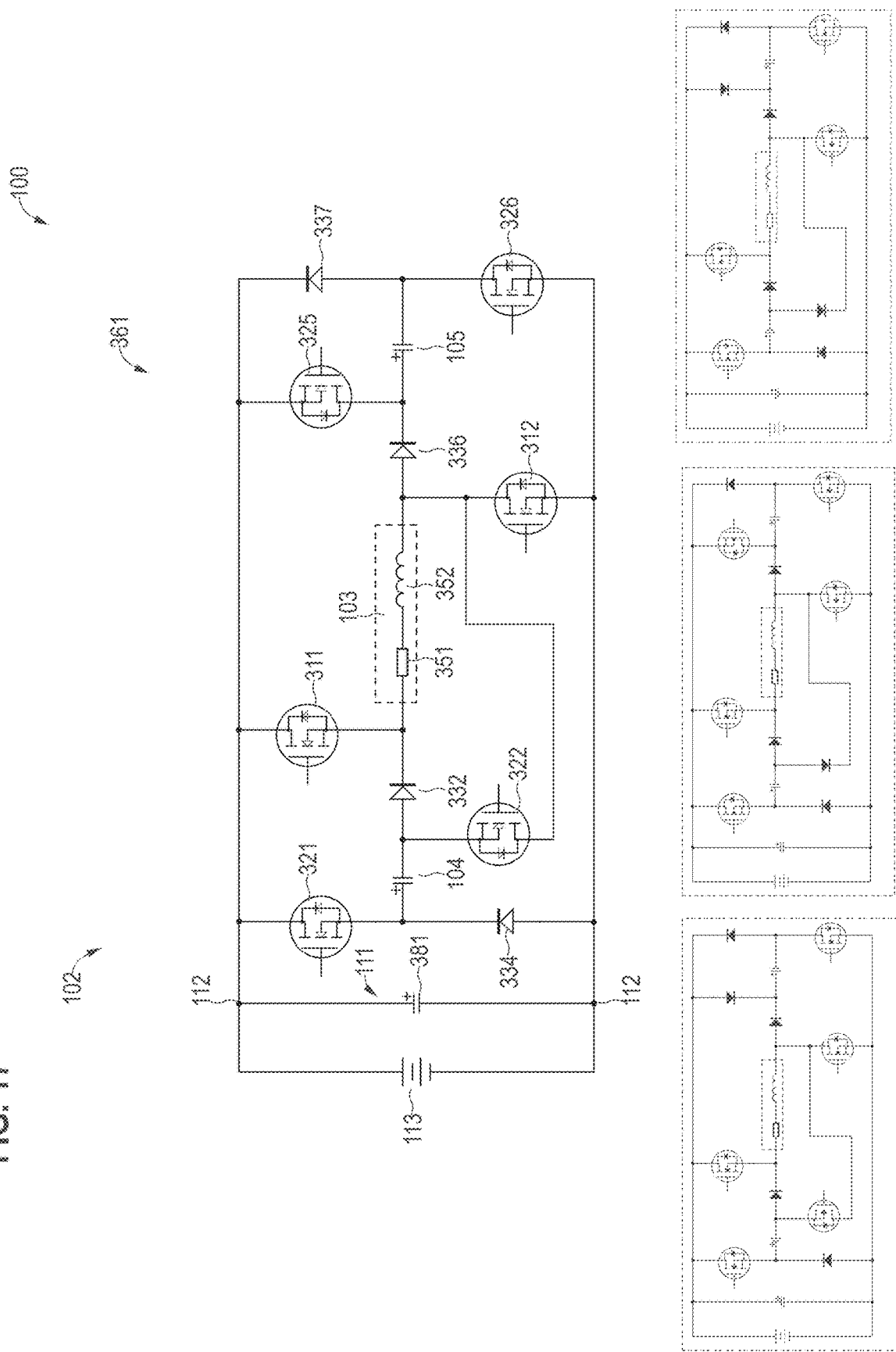
FIG. 17 schematically illustrates the circuit for polarizing magnetic material according to various examples.

FIG. 17 illustrates aspects with respect to the circuit loft FIG. 17 illustrates an example implementation of the driver circuitry 102. The scenario of FIG. 17 essentially corresponds to a combination of the scenario of FIG. 15 and the scenario of FIG. 14.

The inset of FIG. 17 illustrates a scenario where the switch 325 is implemented by a diode. A further inset of FIG. 17 illustrates a scenario where the switch 322 has been implemented by a diode. It would also be possible to implement both the switch 325, as well as the switch 322 by a diode. See further inset.

FIG. 18 illustrates aspects with respect to the circuit 100. FIG. 18 illustrates an example implementation of the driver circuitry 102. The scenario FIG. 18 essentially corresponds to a combination of the scenarios of FIG. 17 and FIG. 16.

The inset of FIG. 18 illustrates a scenario where the switch 325 is implemented by a diode. A further inset of FIG. 18 illustrates a scenario where the switch 322 has been implemented by a diode. It would also be possible to implement both the switch 325, as well as the switch 322 by a diode. See further inset.

Summarizing, above techniques have been described which facilitate short discharge times for an excitation coil. For example, in connection with a BSG, the following scenario can be addressed: Considering that the BSG is running in generating state in high speed. Then, a scenario can occur where the battery main switch is disconnected for some reason. At this point in time, two actions can be executed contemporaneously if the DC supply voltage of the DC power supply exceeds a certain threshold, e.g., 54 V in a scenario of a nominal 48 V DC supply voltage. First, the driver circuitry can be operated to activate the discharge mode; hence, respective switches may be operated in non-conductive state. Further, the system can employ FOC flux weakening set to a 0 torque setpoint with a maximum minus Id. Then, the BSG motor and inverter operators a generator and rectifier to charge the capacitors of the DC power supply, because limited flux weakening can suppress the gap magnetic field partially. Considering that typically damage to electrical components connected to the DC power supply will occur in overvoltage of 70 V is persistent for a time duration of 40 ms or longer, provisioning a capacitor in series connection with the excitation coil in discharge mode helps to avoid such damage.

Specifically, by provisioning one or more capacitors, it is possible to transfer at least a part of energy stored in the excitation coil to the one or more capacitors during discharge mode. The energy stored in the one or more capacitors in the charge mode can then transfer back to the battery.

By connecting the excitation coil and the one or more capacitors in series, at least in the discharge mode, the voltage across the excitation coil increases if compared to the scenario with no capacitors in series connection with the excitation coil, see equation 2.

This helps to reduce the discharge time, see equation 1. The discharge rate of the excitation coil is proportional to the voltage across the excitation coil. Therefore, the discharge rate of the excitation coil is increased if compared to a scenario with no capacitors in series connection with the excitation coil.

If compared to reference implementations using active short techniques, the torque created is reduced. Specifically, according to various examples, it is not required to employ the active short technique; rather, the discharge time can be reduced sufficiently by discharging the excitation coil via the one or more capacitors, optionally in combination with FOC flux weakening.

Further, a discharge of the excitation coil can be achieved without a need for providing electrical energy. The discharging is achieved via the capacitor. This helps to reduce losses and latency. Automatic discharging is possible.

Finally, system complexity can be reduced, because there may be no need for using the active short technique. Then, it is not required to operate a driver circuitry for the respective switches of the active short technique, which may cause problems in safe states. In the various techniques described herein, when entering the system into a safe state, there may be no need to keep any driver circuitries associated with the circuit including the excitation coil active.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

For illustration, various examples have been described in which switches are implemented by FETs. In other scenarios, the switches may be implemented by transistors or mechanical switches or diodes.

Albeit various scenarios have been described in which PWM is used, it is not necessary for the functioning of the invention to use PWM.

For illustration, while above various scenarios have been described in which the excitation coil finds application for polarizing magnetic material of a motor, in other examples the excitation coil may be employed in other use cases, e.g., valves, etc.

What is claimed is:

1. A circuit for polarizing magnetic material using a magnetic field of an excitation coil, the circuit comprising:
   a port configured to provide a connection with a DC power supply,
   at least one capacitor, and
   driver circuitry configured to drive the excitation coil and the at least one capacitor, wherein the driver circuitry is configured to:
      activate a first mode of operation, wherein the circuit is configured to charge the excitation coil in the first mode of operation, and
      activate a second mode of operation, wherein the circuit is configured to discharge the excitation coil via the at least one capacitor to the DC power supply in the second mode of operation,
      wherein the excitation coil and the at least one capacitor are connected in parallel in the first mode of operation and connected in series in the second mode of operation.

2. The circuit of claim 1, wherein the circuit is configured to charge the at least one capacitor to a predetermined voltage in the first mode of operation.

3. The circuit of claim 2, wherein, in the first mode of operation, the circuit is configured to:
   charge the at least one capacitor when a voltage across the at least one capacitor is smaller than the predetermined voltage, and
   discharge the at least one capacitor when the voltage across the at least one capacitor is larger than the predetermined voltage.

4. The circuit of claim 2, wherein the predetermined voltage comprises a voltage provided by the DC power supply.

5. The circuit of claim 1, wherein the circuit is configured to discharge the excitation coil until a current flow through the excitation coil reaches zero in the second mode of operation.

6. The circuit of claim 1,
   wherein the circuit is configured to cause an ascending current flow in the excitation coil in the first mode of operation, and
   wherein the circuit is configured to cause a descending current flow in the excitation coil in the second mode of operation.

7. The circuit of claim 1,
   wherein the circuit is configured to increase an energy stored in the excitation coil in the first mode of operation, and
   wherein the circuit is configured to decrease the energy stored in the excitation coil in the second mode of operation.

8. The circuit of claim 1, wherein the circuit is configured to alternatingly activate the first mode of operation and the second mode of operation in accordance with a pulse-width modulation timing.

9. The circuit of claim 1, wherein the driver circuitry is configured to activate said discharging of the excitation coil depending on at least one of a signal indicative of a voltage across phase windings of a motor or a signal indicative of a voltage at the DC power supply.

10. The circuit of claim 1, wherein the driver circuitry is configured to activate said discharging of the excitation coil depending on a signal indicative of a connection status of the DC power supply towards a DC supply battery.

11. The circuit of claim 1, wherein the driver circuitry comprises an H-bridge for controlling a first current flow between the DC power supply and the excitation coil and for controlling a second current flow between the DC power supply and the at least one capacitor.

12. The circuit of claim 1,
   wherein the driver circuitry comprises a first switch and a second switch connected in series with the excitation coil, and
   wherein the driver circuitry further comprises a third switch and a fourth switch connected in series with the at least one capacitor.

13. The circuit of claim 1, wherein the driver circuitry comprises a choke connected in series with the at least one capacitor.

14. The circuit of claim 1, wherein the excitation coil and the at least one capacitor are connected in series via a switch.

15. A system, comprising:
   the circuit of claim 1,
   the excitation coil, and
   an electric motor comprising the magnetic material.

16. A method of polarizing magnetic material using a magnetic field of an excitation coil, the method comprising:
   charging the excitation coil in a first operating mode; and
   discharging the excitation coil via at least one capacitor in a second operating mode,
   wherein the excitation coil and the at least one capacitor are connected in parallel in the first operating mode and connected in series in the second operating mode.

* * * * *